(12) United States Patent
Taniguchi

(10) Patent No.: US 11,056,475 B2
(45) Date of Patent: Jul. 6, 2021

(54) SEMICONDUCTOR MODULE

(71) Applicant: Fuji Electric Co., Ltd., Kanagawa (JP)

(72) Inventor: Katsumi Taniguchi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 6 days.

(21) Appl. No.: 16/560,278

(22) Filed: Sep. 4, 2019

(65) Prior Publication Data
US 2020/0091130 A1 Mar. 19, 2020

(30) Foreign Application Priority Data
Sep. 14, 2018 (JP) .............................. JP2018-173083

(51) Int. Cl.
| | |
|---|---|
| *H01L 25/18* | (2006.01) |
| *H01L 23/538* | (2006.01) |
| *H01L 25/07* | (2006.01) |
| *H01L 23/31* | (2006.01) |
| *G01R 19/00* | (2006.01) |
| *H01L 49/02* | (2006.01) |
| *H01L 21/48* | (2006.01) |

(Continued)

(52) U.S. Cl.
CPC .......... *H01L 25/18* (2013.01); *G01R 19/0092* (2013.01); *H01L 21/4853* (2013.01); *H01L 21/565* (2013.01); *H01L 23/3121* (2013.01); *H01L 23/5386* (2013.01); *H01L 25/072* (2013.01); *H01L 25/16* (2013.01); *H01L 25/50* (2013.01); *H01L 28/20* (2013.01)

(58) Field of Classification Search
CPC ......... H01L 25/18; H01L 25/50; H01L 25/16; H01L 25/072; H01L 23/5386; H01L 23/49811; H01L 23/5385; H01L 23/3735; H01L 23/3121; H01L 28/20; H01L 21/4853; H01L 21/565; G01R 19/0092
See application file for complete search history.

(56) References Cited

U.S. PATENT DOCUMENTS

2002/0189859 A1* 12/2002 Shiraishi .............. H05K 3/4617
174/261
2004/0041256 A1 3/2004 Takehara et al.
(Continued)

FOREIGN PATENT DOCUMENTS

JP 2680443 B2 11/1997
JP H10-209213 A 8/1998
(Continued)

*Primary Examiner* — Sitaramarao S Yechuri
(74) *Attorney, Agent, or Firm* — Chen Yoshimura LLP

(57) ABSTRACT

A semiconductor module includes: a first circuit substrate having a conductive layer disposed on an insulating plate; a plurality of semiconductor elements on the conductive layer, a second circuit substrate disposed above the semiconductor elements, the second circuit substrate having a main current wiring layer and a control wiring layer positioned in a layer above the main current wiring layer; a first lead terminal vertically extending upwards from and in contact with the main current wiring layer; a second lead terminal vertically extending upwards from and in contact with the conductive layer of the first circuit substrate; a third lead terminal vertically extending upwards from and in contact with the control wiring layer; and a sealing material covering at least some of the elements mentioned above.

20 Claims, 19 Drawing Sheets

(51) Int. Cl.
*H01L 21/56* (2006.01)
*H01L 25/00* (2006.01)
*H01L 25/16* (2006.01)

(56) References Cited

U.S. PATENT DOCUMENTS

| | | | |
|---|---|---|---|
| 2014/0346676 A1* | 11/2014 | Horio | H01L 24/49 257/773 |
| 2015/0380374 A1* | 12/2015 | Nakamura | H01L 25/18 361/783 |
| 2016/0233146 A1 | 8/2016 | Nakamura | |
| 2017/0133308 A1* | 5/2017 | Inaba | H01L 24/32 |
| 2017/0271230 A1 | 9/2017 | Inaba | |
| 2018/0226356 A1* | 8/2018 | Ikeda | H01L 23/31 |

FOREIGN PATENT DOCUMENTS

| | | |
|---|---|---|
| JP | H11-298142 A | 10/1999 |
| JP | 2004-111938 A | 4/2004 |
| JP | 2017-157693 A | 9/2017 |
| JP | 2017-170627 A | 9/2017 |
| WO | 2015/151235 A1 | 10/2015 |

\* cited by examiner

SEMICONDUCTOR MODULE

BACKGROUND OF THE INVENTION

Technical Field

The present invention relates to a semiconductor module on which a plurality of semiconductor elements are mounted.

Background Art

A semiconductor module is conventionally known in which a plurality of power semiconductor elements are mounted on the upper surface side of an insulating substrate (first circuit substrate) that is obtained by forming conductor foil on the upper and lower surfaces of a ceramic plate. In this semiconductor module, a circuit substrate (second circuit substrate) in which pins are inserted is used to electrically connect first main electrodes and control electrodes on the upper surface side of power semiconductor elements with the conductor foil on the upper surface side of the first circuit substrate. Lead terminals for connecting to outside are connected to the conductor foil on the upper surface side of the first circuit substrate. The power semiconductor elements are sealed by a sealing material.

On the conductor foil on the upper surface side of the first circuit substrate, circuit patterns are formed that respectively and individually connect to the first main electrodes and control electrodes on the upper surface side of the power semiconductor elements, and to second main electrodes on the lower surface side of the power semiconductor elements, and the lead terminals are connected to these circuit patterns. Due to this, on the conductor foil on the upper surface side of the first circuit substrate, there are circuit patterns on the conductor foil where power semiconductor elements are not mounted, which makes the size of the semiconductor module larger. Furthermore, there are constraints on the arrangement and orientation of the power semiconductor elements on the conductor foil on the upper surface side of the first circuit substrate, and thus it is difficult to improve the heat dissipation efficiency of heat generated by the power semiconductor elements.

Patent Document 1 discloses a configuration in which power semiconductor elements are mounted on a heat dissipation substrate, and ceramic substrate parts are disposed above the power semiconductor elements. Patent Document 2 discloses a semiconductor device that uses a low temperature co-fired ceramic (LTCC) substrate. Patent Document 3 discloses a semiconductor module in which pins are erected on a printed substrate. Patent Document 4 discloses a semiconductor device in which a ceramic plate is disposed on the upper layer of a printed substrate. Patent Document 5 discloses providing fixing rods on top of a lower side printed substrate, and performing positioning and fixing by inserting the fixing rods into holes provided in two corners of a ceramic BGA substrate. Patent Documents 6 and 7 disclose a multilayer ceramic substrate.

RELATED ART DOCUMENTS

Patent Documents

Patent Document 1: Japanese Patent Application Laid-Open Publication No. 2017-157693
Patent Document 2: Japanese Patent Application Laid-Open Publication No. 2004-111938
Patent Document 3: Japanese Patent Application Laid-Open Publication No. 2017-170627
Patent Document 4: WO 2015/151235
Patent Document 5: Japanese Patent Application Laid-Open Publication No. H10-209213
Patent Document 6: Japanese Patent Application Laid-Open Publication No. H11-298142
Patent Document 7: Japanese Patent No. 2680443 Specification

SUMMARY OF THE INVENTION

In view of the aforementioned problems, the present invention aims at providing a semiconductor module that can be made smaller and improve heat dissipation efficiency.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor module, comprising: a first circuit substrate having an insulating plate and a conductive layer disposed on the insulating plate; a plurality of semiconductor elements on the conductive layer, the semiconductor elements each having a control electrode and a first main electrode on an upper surface thereof and a second main electrode on a bottom surface thereof, the second main electrode being in contact with and electrically connected to the conductive layer; a second circuit substrate disposed above the semiconductor elements, the second circuit substrate having an insulating layer, a main current wiring layer embedded in the insulating layer, and a control wiring layer embedded in the insulating layer, the control wiring layer being positioned in a layer above the main current wiring layer; main current pins connecting each of the first main electrodes and the main current wiring layer; control pins connecting each of the control electrodes and the control wiring layer; a first lead terminal vertically extending upwards from and in contact with the main current wiring layer of the second circuit substrate; a second lead terminal vertically extending upwards from and in contact with the conductive layer of the first circuit substrate; a third lead terminal vertically extending upwards from and in contact with the control wiring layer of the second circuit substrate; and a sealing material covering at least an upper surface of the first circuit substrate, side surfaces and the upper surfaces of the semiconductor elements, and a lower surface of the second circuit substrate.

At least some of the aspects of the present invention make it possible to provide a semiconductor module that can be made smaller and improve heat dissipation efficiency.

It is to be understood that both the foregoing general description and the following detailed description are exemplary and explanatory, and are intended to provide further explanation of the invention as claimed.

DETAILED DESCRIPTION OF EMBODIMENTS

Figure 1:
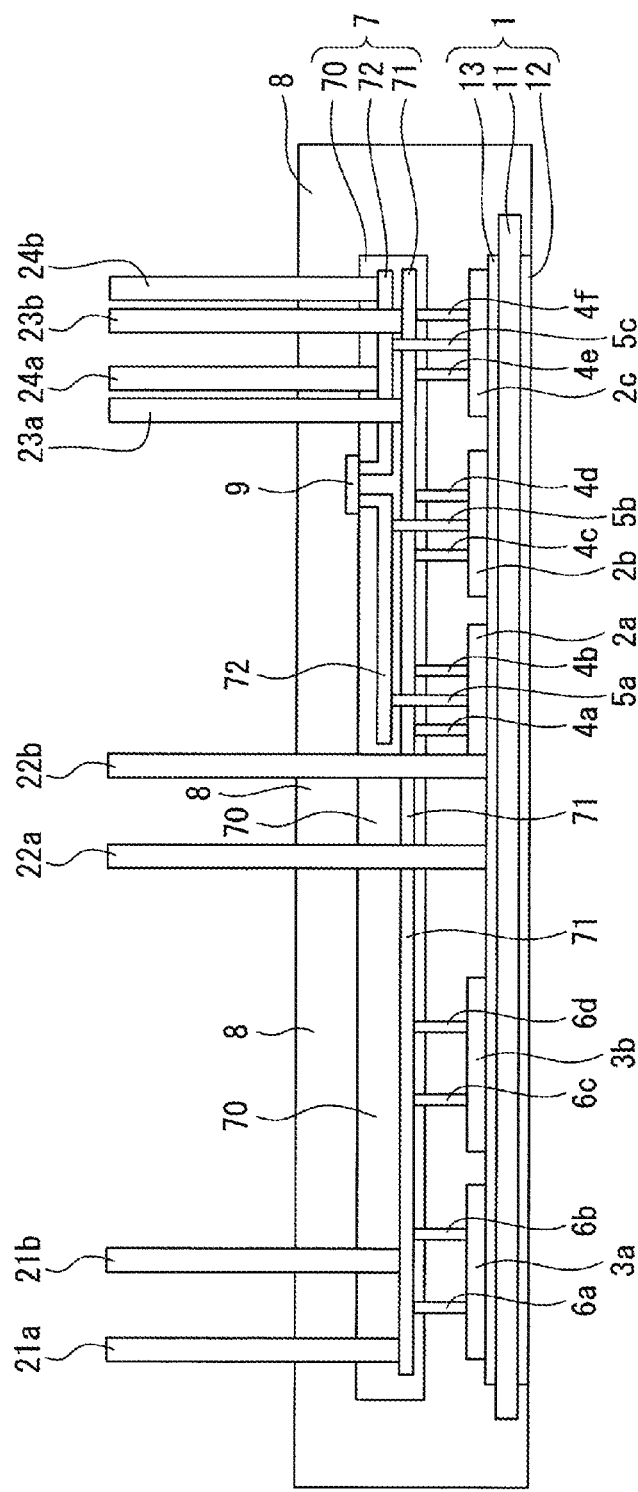
FIG. 1 is a side view showing one example of a semiconductor module according to Embodiment 1 of the present invention.

Embodiments 1 and 2 of the present invention will be described below with reference to the drawings. In the description below, portions in the drawings that are the same or similar will be assigned the same or similar reference characters. However, it should be noted that the drawings are schematic, and that the relation between the thickness and planar dimensions and the proportion of thicknesses of the respective layers etc. differ in practice. Therefore, specific thicknesses or dimensions should be determined in reference to the description below. Furthermore, it goes without saying that there are parts that differ in the dimensional relationships and proportions thereof even among the drawings.

In the present specification, when the semiconductor elements are field effect transistors (FETs) or static induction transistors (SITs), "first main electrodes" of the semiconductor elements means electrodes serving as either source electrodes or drain electrodes where the main current flows in or flows out. "First main electrodes" of the semiconductor elements means electrodes where the main current flows into or flows out of the semiconductor elements. For example, when the semiconductor elements are insulated gate bipolar transistors (IGBTs), "first main electrodes" corresponds to electrodes serving either as emitter electrodes or collector electrodes. When the semiconductor elements are static inductor thyristors (SI thyristors) or gate turn-off thyristors (GTO), "first main electrodes" means electrodes serving either as anode electrodes or cathode electrodes.

Furthermore, if the semiconductor elements are FETs or SITs, "second main electrodes" of the semiconductor elements means electrodes serving as whichever of the source electrodes or drain electrodes that are not the first main electrodes. For IGBTs, "second main electrodes" means electrodes serving as whichever of the emitter electrodes or collector electrodes that are not the first main electrodes. For SI thyristors or GTOs, "second main electrodes" means electrodes serving as whichever of the anode electrodes or cathode electrodes that are not the first main electrodes.

Thus, if the "first main electrodes" of the semiconductor elements are source electrodes, then "second main electrodes" means drain electrodes. If the "first main electrodes" of the semiconductor elements are emitter electrodes, then "second main electrodes" means collector electrodes. If the "first main electrodes" of the semiconductor elements are anode electrodes, then "second main electrodes" means cathode electrodes. For semiconductor elements with a symmetrical structure such as MOSFETs, there are also cases where it is possible for the function of the "first main electrodes" and "second main electrodes" to be interchanged if the bias relationship is interchanged.

The definition of directions such as up-down in the description below are merely definitions for convenience of explanation and do not limit the technical idea of the present invention. For example, if an object is observed after being rotated 90°, up-down is converted to left-right, and if observed after being rotated 180°, up-down is inverted.

Embodiment 1

(Configuration of Semiconductor Module)

Figure 2:
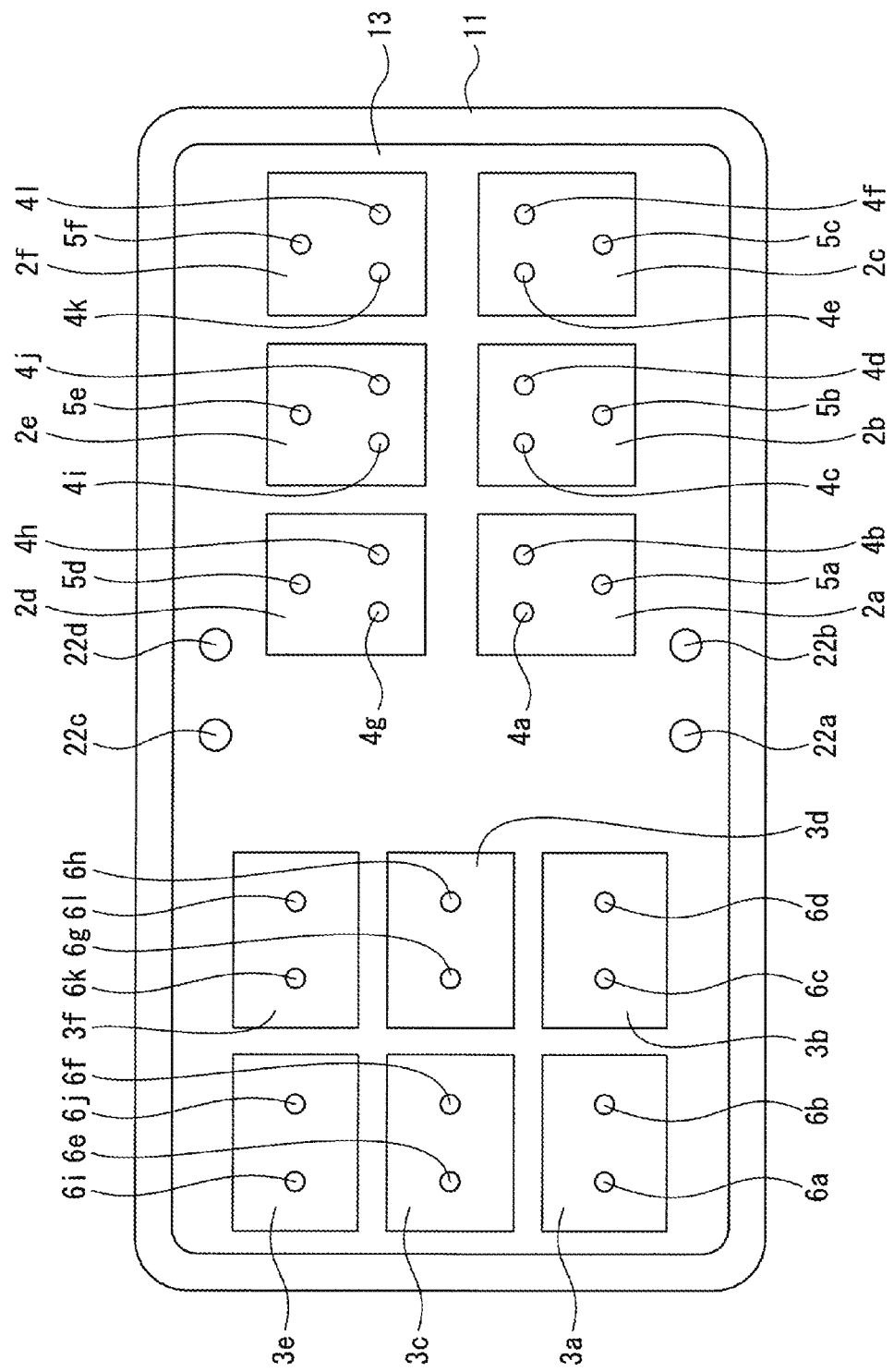
FIG. 2 is a top view showing one example of a first circuit substrate of the semiconductor module according to Embodiment 1 of the present invention.

A 1-in-1 type semiconductor module that forms a part of a half-bridge circuit is illustratively shown as the semiconductor module according to Embodiment 1 of the present invention. FIG. 1 is a side view of the semiconductor module according to Embodiment 1 of the present invention, and FIG. 2 is a top view of the semiconductor module according to Embodiment 1 of the present invention of a first circuit substrate 1 and semiconductor elements (semiconductor chips) 2a to 2f and 3a to 3f seen from above while omitting a second circuit substrate 7 and a sealing material 8. The side view of the semiconductor module seen from the lower side of FIG. 2 corresponds to FIG. 1.

As shown in FIG. 1 and FIG. 2, the semiconductor module according to Embodiment 1 of the present invention includes: the first circuit substrate 1; the semiconductor elements 2a, 2b, 2c, 2d, 2e, 2f, 3a, 3b, 3c, 3d, 3e, 3f disposed on the first circuit substrate 1; the second circuit substrate 7 disposed above the semiconductor elements 2a to 2f and 3a to 3*f*; and the sealing material 8 that seals the semiconductor elements 2*a* to 2*f* and 3*a* to 3*f*.

The first circuit substrate 1 may be a direct copper bonding (DCB) substrate, an active metal brazing (AMB) substrate, etc., for example. The thickness of the first circuit substrate 1 is approximately 1.0 mm to approximately 2.5 mm, for example. The first circuit substrate 1 has an insulating plate 11, a conductive layer 12 disposed on the lower surface of the insulating plate 11, and a conductive layer 13 disposed on the upper surface of the insulating plate 11. The insulating plate 11 is a plate-shaped member formed of an insulating ceramic such as aluminum oxide ($Al_2O_3$), aluminum nitride (AlN), or silicon nitride ($Si_3N_4$). A conductor foil or the like such as copper (Cu) or aluminum (Al) can be used as the conductive layers 12, 13.

In Embodiment 1 of the present invention, a case is illustratively shown in which two types of semiconductor elements are mounted: a plurality (six) of the semiconductor elements 2*a* to 2*f*, and a plurality (six) of the semiconductor elements 3*a* to 3*f*. Among these, as shown on the right side in FIG. 2, the semiconductor elements 2*a* to 2*f* are arranged in two rows along the longitudinal direction (the left-right direction in FIG. 2) of the semiconductor module. The semiconductor elements 2*a* to 2*f* can be formed of power semiconductor elements such as transistors such as MOSFETs or IGBTs, or thyristors, for example. The semiconductor elements 2*a* to 2*f* may be formed of a silicon (Si) substrate, for example, or may be formed of a wide-bandgap semiconductor substrate such as silicon carbide (SiC) or gallium nitride (GaN).

The semiconductor elements 2*a* to 2*f* each have a control electrode (gate electrode) and a first main electrode (source electrode) on the upper surface side, and a second main electrode (drain electrode) on the lower surface side. The first main electrodes of the semiconductor elements 2*a* to 2*f* are electrically connected to main current pins (conductive posts) 4*a*, 4*b*, 4*c*, 4*d*, 4*e*, 4*f*, 4*g*, 4*h*, 4*i*, 4*j*, 4*k*, 4*l*. The control electrodes of the semiconductor elements 2*a* to 2*f* are electrically connected to control pins (conductive posts) 5*a*, 5*b*, 5*c*, 5*d*, 5*e*, 5*f*. The main current pins 4*a* to 4*l* and the control pins 5*a* to 5*f* are disposed so as to extend upward from the upper surface of the semiconductor elements 2*a* to 2*f*, and the upper parts of the main current pins 4*a* to 4*l* and the control pins 5*a* to 5*f* are inserted into the second circuit substrate 7. The second main electrodes of the semiconductor elements 2*a* to 2*f* are electrically connected to the conductive layer 13 on the upper surface side of the first circuit substrate 1.

Meanwhile, as shown on the left side in FIG. 2, the semiconductor elements 3*a* to 3*f* are arranged in two columns along the direction (up-down direction in FIG. 2) orthogonal to the longitudinal direction of the semiconductor module. The semiconductor elements 3*a* to 3*f* can be formed of freewheeling diodes (FWDs), for example.

The semiconductor elements 3*a* to 3*f* each have a first main electrode (anode electrode) on the upper surface side, and a second main electrode (cathode electrode) on the lower surface side. The first main electrodes of the semiconductor elements 3*a* to 3*f* are electrically connected to main current pins (conductive posts) 6*a* to 6*l*. The main current pins 6*a* to 6*l* are disposed extending upward from the upper surfaces of the semiconductor elements 3*a* to 3*f*, and the upper parts of the main current pins 6*a* to 6*l* are inserted into the second circuit substrate 7. The second main electrodes of the semiconductor elements 3*a* to 3*f* are electrically connected to the conductive layer 13 on the upper surface side of the first circuit substrate 1.

There are no particular limitations to the type, number, and positions of the semiconductor elements 2*a* to 2*f* and 3*a* to 3*f* mounted on the first circuit substrate 1. For example, the configuration may have only the semiconductor elements 2*a* to 2*f* mounted, without the semiconductor elements 3*a* to 3*f*.

A conductive metal such as Cu or Al, for example, can be used as the material of the main current pins 4*a* to 4*l*, the control pins 5*a* to 5*f*, and the main current pins 6*a* to 6*l*. In Embodiment 1 of the present invention, a case is illustratively shown in which the main current pins 4*a* to 4*l*, the control pins 5*a* to 5*f*, and the main current pins 6*a* to 6*l* are formed in columnar shapes, but the main current pins 4*a* to 4*l*, the control pins 5*a* to 5*f*, and the main current pins 6*a* to 6*l* may be formed in other shapes, such as prism shapes, plate shapes, or block shapes.

Second lead terminals (second external connection terminals) 22*a*, 22*b*, 22*c*, 22*d* for extracting the potentials of the second main electrodes of the semiconductor elements 2*a* to 2*f* and 3*a* to 3*f* to outside are electrically connected to the conductive layer 13 on the upper surface side of the first circuit substrate 1. The second lead terminals 22*a* to 22*d* are disposed so as to extend upward from the conductive layer 13, go through the second circuit substrate 7, and protrude out from the upper surface of the sealing material 8.

The second lead terminals 22*a* to 22*d* can be formed of a conductive metal such as Cu or Al, for example. In Embodiment 1 of the present invention, a case is illustratively shown in which the second lead terminals 22*a* to 22*d* are formed in columnar shapes, but the second lead terminals 22*a* to 22*d* may be formed in other shapes, such as prism shapes, plate shapes, or block shapes, and the portions of the terminals protruding out from the upper surface of the sealing material 8 may bend. There are also no particular limitations for the number or position of the second lead terminals 22*a* to 22*d*.

The upper surfaces of the semiconductor elements 2*a* to 2*f* and 3*a* to 3*f* and the lower surface of the second circuit substrate 7 are separated by approximately 1.0 mm, for example. A ceramic multilayer substrate such as a low temperature co-fired ceramic (LTCC) substrate can be used as the second circuit substrate 7, for example. The thickness of the second circuit substrate 7 is approximately 1.0 mm to approximately 1.5 mm, for example. The second circuit substrate 7 has an insulating layer 70 made of ceramic or the like, a main current wiring layer 71 embedded inside the insulating layer 70, and a control wiring layer 72 that is embedded inside the insulating layer 70 and in a layer above the main wiring layer 71. A resistor element 9 functioning as a gate resistor is disposed on the upper surface of the insulating layer 70.

A ceramic material of which the main component is $Al_2O_3$, AN, $Si_3N_4$, or the like can be used as the material of the insulating layer 70. A conductive metal such as silver (Ag) or copper (Cu), for example, can be used as the material of the main current wiring layer 71 and the control wiring layer 72. The thickness of the main current wiring layer 71 and the control wiring layer 72 is approximately 0.2 mm, for example. The thickness of the insulating layer 70 positioned on the upper surface side of the main current wiring layer 71, between the main current wiring layer 71 and the control wiring layer 72, and on the lower surface side of the control wiring layer 72, is approximately 0.2 mm for each, for example.

Figure 3:
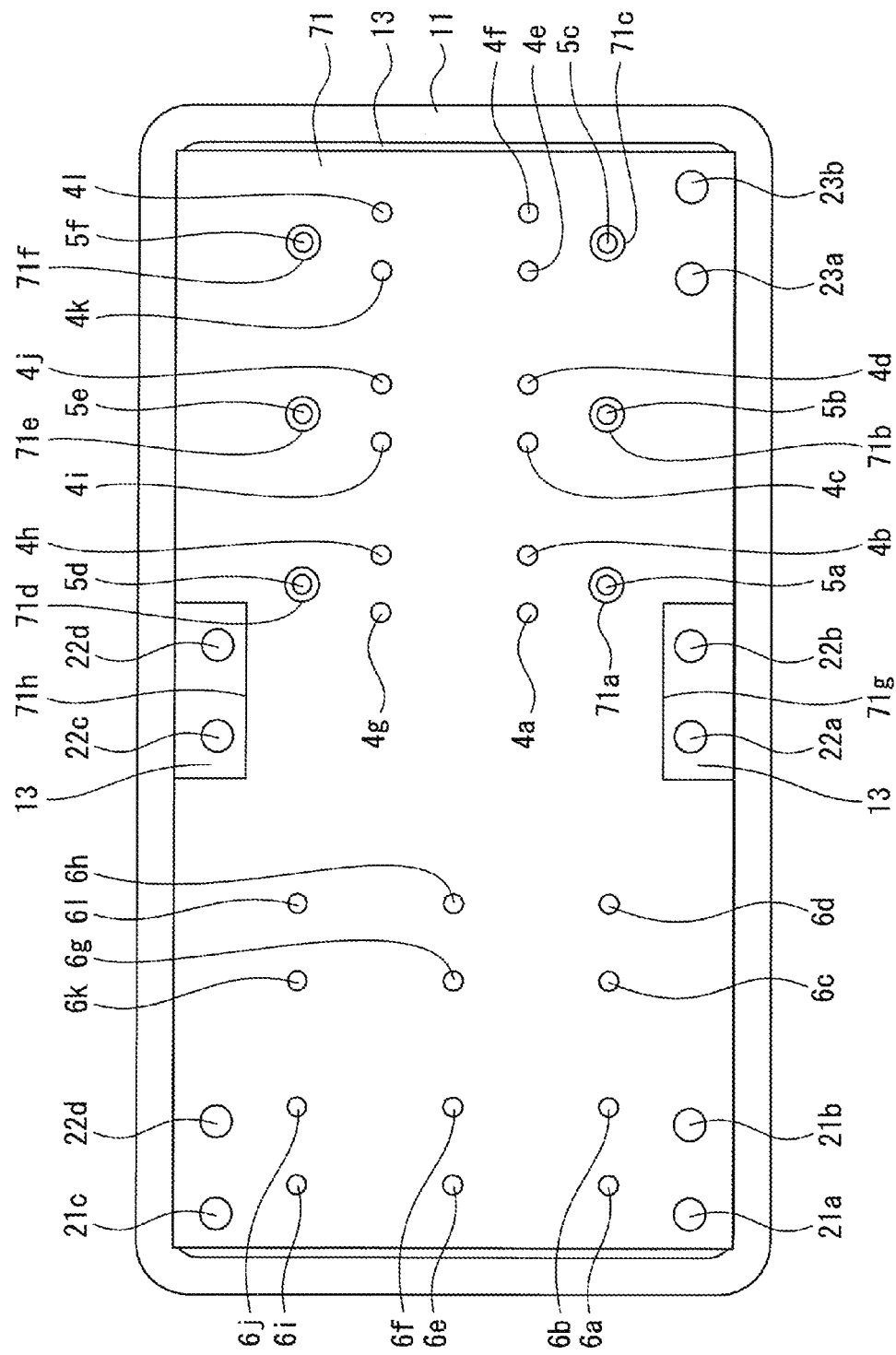
FIG. 3 is a top view showing one example of a main current wiring layer of the semiconductor module according to Embodiment 1 of the present invention.

FIG. 3 shows a planar pattern of the main current wiring layer 71 on the lower layer side of the second circuit substrate 7 in correspondence with the first circuit substrate 1 and the semiconductor elements 2*a* to 2*f* and 3*a* to 3*f*. The main current wiring layer 71 is electrically connected by the main current pins 4a to 4l and 6a to 6l to the first main electrodes of the semiconductor elements 2a to 2f and 3a to 3f. The main current wiring layer 71 has openings (through-holes) 71a, 71b, 71c, 71d, 71e, 71f that the control pins 5a to 5f go through, and opening (cutouts) 71g, 71h that the second lead terminals 22a to 22d go through. The main current wiring layer 71, the control pins 5a to 5f, and the second lead terminals 22a to 22d are insulated via portions of the insulating layer 70.

First lead terminals (first external connection terminals) 21a, 21b, 21c, 21d for extracting the potentials of the first main electrodes of the semiconductor elements 2a to 2f and 3a to 3f to outside, and sense lead terminals 23a and 23b for measuring the main current, are electrically connected to the main current wiring layer 71. The first lead terminals 21a to 21d and the sense lead terminals 23a, 23b are disposed so as to extend upward from the main wiring layer 71, go through insulating layer 70 on the upper side of the main current wiring layer 71 as shown in FIG. 1, and protrude out from the upper surface of the sealing material 8. The first lead terminals 21a to 21d and the sense lead terminals 23a, 23b are positioned above the conductive layer 13 so as to overlap with the conductive layer 13 in the direction normal to the upper surface of the main current wiring layer 71.

The first lead terminals 21a to 21d and sense lead terminals 23a, 23b can be formed of a conductive metal such as Cu or Al, for example. In Embodiment 1 of the present invention, a case is illustratively shown in which the first lead terminals 21a to 21d and sense lead terminals 23a, 23b are formed in columnar shapes, but the first lead terminals 21a to 21d and the sense lead terminals 23a, 23b may be formed in other shapes, such as prism shapes, plate shapes, or block shapes, and the portions of the terminals protruding from the upper surface of the sealing material 8 may bend. There are also no particular limitations to the number or position of the first lead terminals 21a to 21d and the sense lead terminals 23a, 23b.

Figure 4:
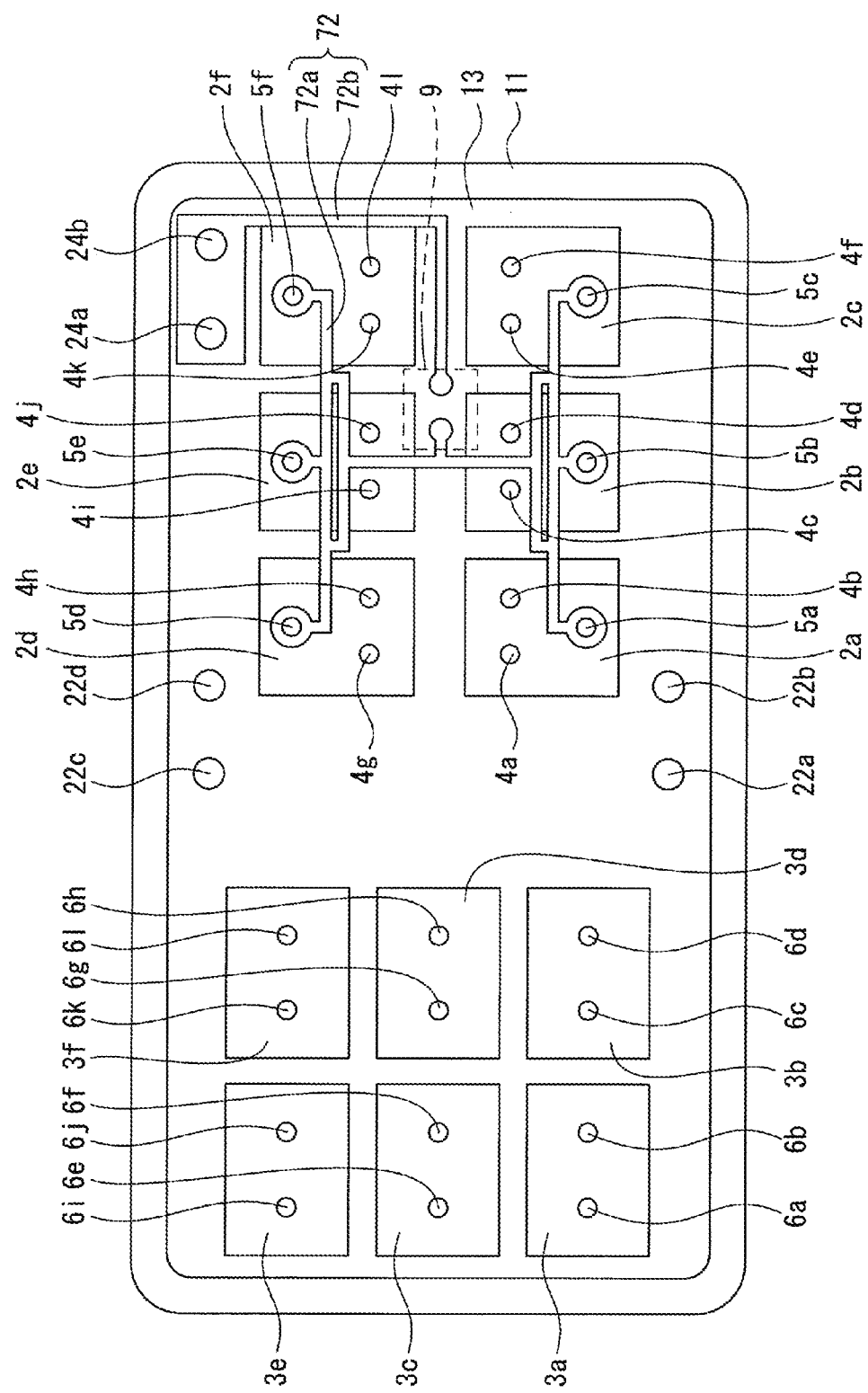
FIG. 4 is a top view showing one example of a control wiring layer of the semiconductor module according to Embodiment 1 of the present invention.

FIG. 4 shows a planar pattern of the control wiring layer 72 on the upper layer side of the second circuit substrate 7 in correspondence with the first circuit substrate 1 and the semiconductor elements 2a to 2f and 3a to 3f. The control wiring layer 72 is electrically connected by the control pins 5a to 5f to the control electrodes of the semiconductor elements 2a to 2f. Third lead terminals (third external connection terminals) 24a, 24b for applying a prescribed voltage from outside to the control electrodes of the semiconductor elements 2a to 2f are electrically connected to the control wiring layer 72.

The third lead terminals 24a, 24b are disposed so as to extend upward from the top of the control wiring layer 72, go through the insulating layer 70 on the upper side of the control wiring layer 72 as shown in FIG. 1, and protrude out from the upper surface of the sealing material 8. The third lead terminals 24a, 24b are positioned above the conductive layer 13 so as to overlap with the conductive layer 13 in the direction normal to the upper surface of the control wiring layer 72. The resistor element 9 is electrically connected between the control wiring layer 72 and the third lead terminals 24a, 24b.

The third lead terminals 24a, 24b can be formed of a conductive metal such as Cu or Al, for example. In Embodiment 1 of the present invention, a case is illustratively shown in which the third lead terminals 24a, 24b are formed in columnar shapes, but the third lead terminals 24a, 24b may be formed in other shapes, such as prism shapes, plate shapes, or block shapes, and the portions of the terminals protruding from the upper surface of the sealing material 8 may bend. There are also no particular limitations for the number or position of the third lead terminals 24a, 24b.

As shown in FIG. 4, in order to wire the plurality of control pins 5a to 5f at equal lengths, the control wiring layer 72 includes a first wiring part 72a for wiring the plurality of control pins 5a to 5f and the resistor element 9, and a second wiring part 72b for wiring the third lead terminals 24a, 24b and the resistor element 9. The wiring patterns of the first wiring part 72a and the second wiring part 72b are shown as examples and are not limited to these.

The sealing material 8 shown in FIG. 1 is illustratively shown as having a substantially cuboid shape. The sealing material 8 covers at least the upper surface of the first circuit substrate 1, the side surfaces and upper surfaces of the semiconductor elements 2a to 2f and 3a to 3f, and the lower surface of the second circuit substrate 7. The sealing material 8 seals the semiconductor elements 2a to 2f and 3a to 3f so as to expose the lower surface of the first conductive layer 12 of the first circuit substrate 1, and so as to expose the upper ends of the first lead terminals 21a to 21d, the upper ends of the senses lead terminals 23a and 23b, the upper ends of the second lead terminals 22a to 22d, and the upper ends of the third lead terminals 24a, 24b. A resin material such as a hard thermosetting resin with high heat resistance can be used as the sealing material 8, for example, and specifically, an epoxy resin, a maleimide resin, a cyanate resin, etc. can be used.

Figure 5:
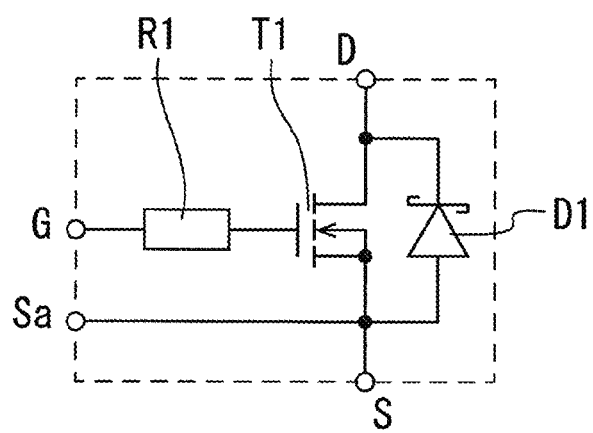
FIG. 5 is an equivalent circuit diagram of the semiconductor module according to Embodiment 1 of the present invention.

FIG. 5 is an equivalent circuit diagram of the semiconductor module according to Embodiment 1 of the present invention. A transistor T1 shown in FIG. 5, which is a MOSFET, corresponds to the semiconductor elements 2a to 2f shown in FIG. 1, FIG. 2, etc. Furthermore, a diode element D1, which is a FWD connected in reverse parallel to the transistor T1, corresponds to the semiconductor elements 3a to 3f shown in FIG. 1, FIG. 2, etc.

A terminal D on the drain side of the transistor T1 corresponds to the second lead terminals 22a to 22d shown in FIG. 1, FIG. 2, etc. A terminal S on the source side of the transistor T1 corresponds to the first lead terminals 21a to 21d shown in FIG. 1, FIG. 3, etc. A terminal Sa on the source side of the transistor T1 corresponds to the sense lead terminals 23a, 23b shown in FIG. 1, FIG. 3, etc. A resistor R1 on the gate side of the transistor T1 corresponds to the resistor element 9 shown in FIG. 1, and a terminal G via the resistor R1 on the gate side of the transistor T1 corresponds to the third lead terminals 24a, 24b shown in FIG. 1, FIG. 4, etc.

Comparative Example

Figure 6:
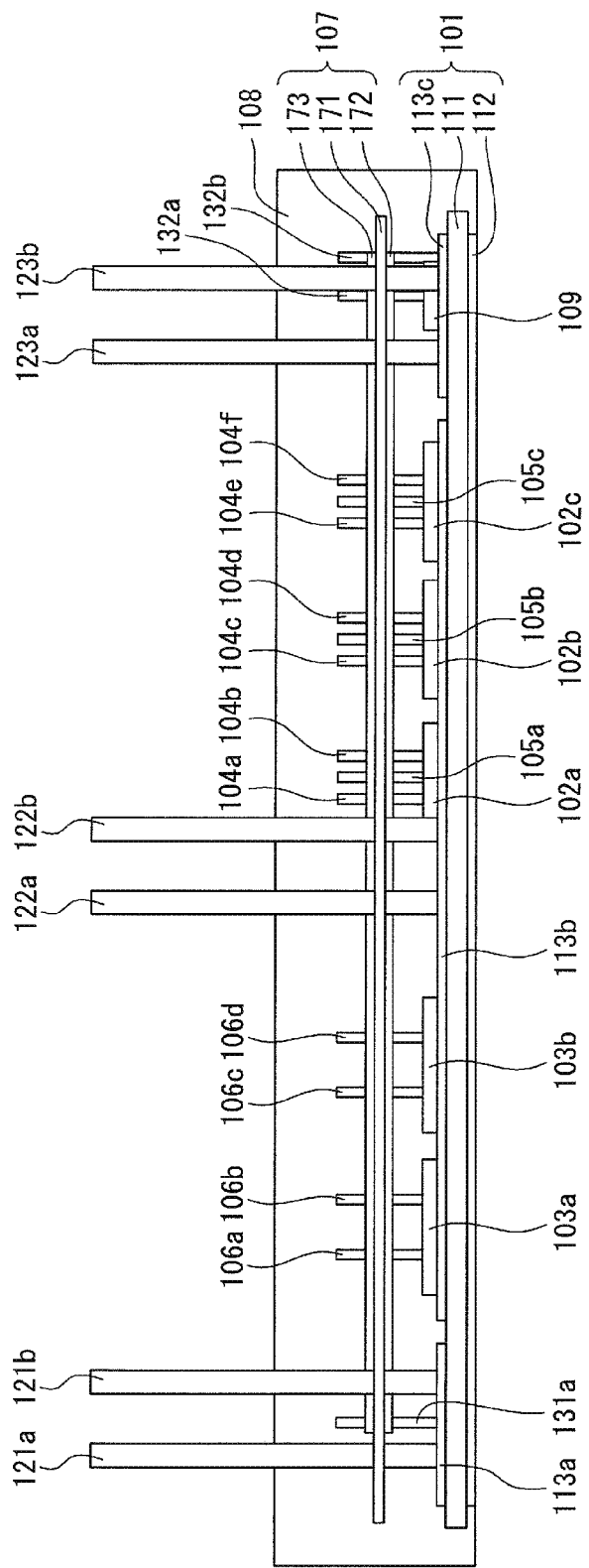
FIG. 6 is a side view showing a semiconductor module according to a comparative example.

A semiconductor module according to a comparative example will be described with reference to FIG. 6 and FIG. 7. FIG. 6 is a side view of the semiconductor module according to the comparative example, and FIG. 7 is a top view of the semiconductor module according to the comparative example of a first circuit substrate 101 and semiconductor elements 102a, 102b, 102c, 102d, 102e, 102f, 103a, 103b, 103c, 103d, 103e, 103f seen from above while omitting a second circuit substrate 107 and a sealing material 108.

Figure 7:
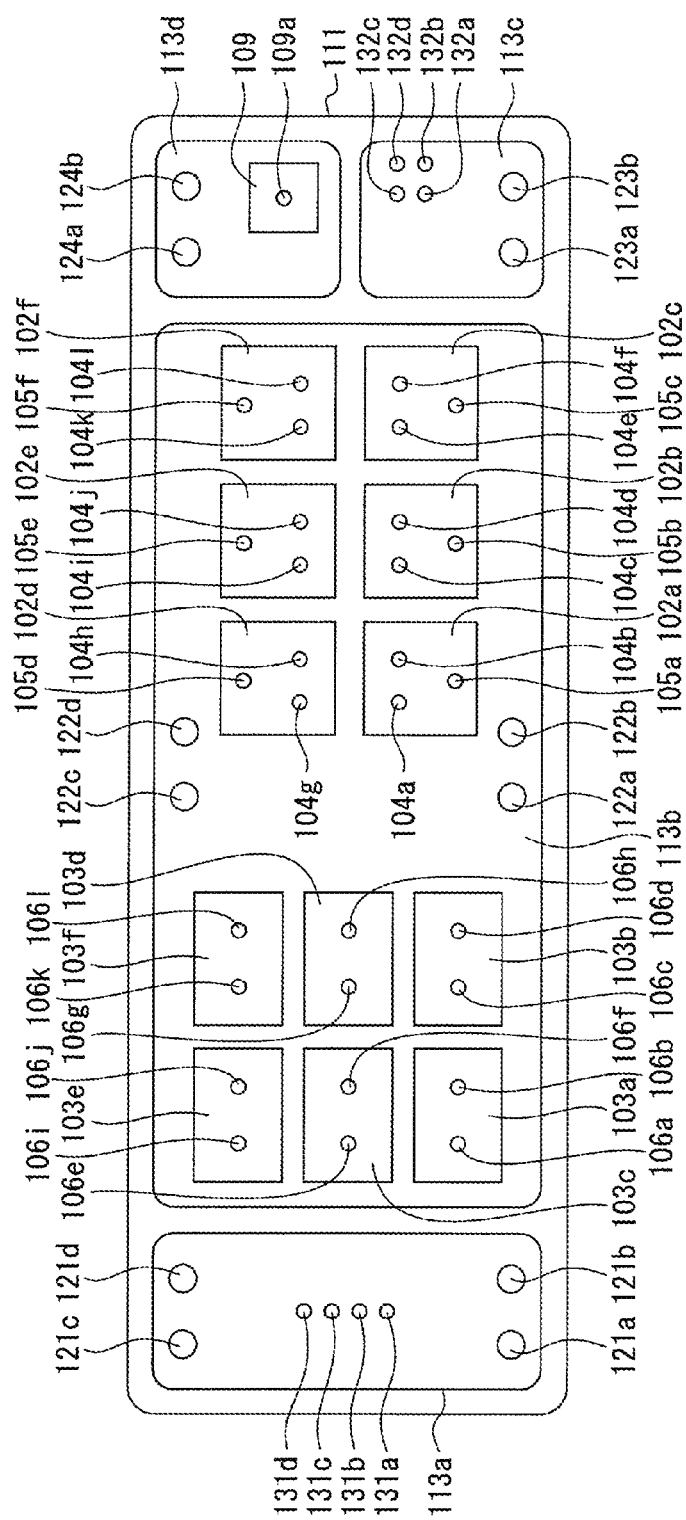
FIG. 7 is a top view showing a first circuit substrate of the semiconductor module according to the comparative example.

As shown in FIG. 6 and FIG. 7, the semiconductor module according to the comparative example includes: the first circuit substrate 101; the semiconductor elements 102a to 102f and 103a to 103f mounted on the first circuit substrate 101; the second circuit substrate 107 disposed above the semiconductor elements 102a to 102f and 103a to 103f; and the sealing material 108 that seals the semiconductor elements 102a to 102f and 103a to 103f.

The first circuit substrate 101 has an insulating plate 111, a conductive layer 112 disposed on the lower surface of the insulating plate 111, and conductive layers 113a, 113b, 113c, 113d disposed on the upper surface of the insulating plate 111. The first circuit substrate 101 of the semiconductor module according to the comparative example differs from the first circuit substrate 1 of the semiconductor module according to Embodiment 1 of the present invention in that the conductive layers 113a to 113d of the upper surface side are divided into four circuit patterns.

The semiconductor elements 102a to 102f are power semiconductor elements such as MOSFETs. The first main electrodes on the upper surface side of the semiconductor elements 102a to 102f are electrically connected to main current pins 104a, 104b, 104c, 104d, 104e, 104f, 104g, 104h, 104i, 104j, 104k, 104l. The control electrodes on the upper surface side of the semiconductor elements 102a to 102f are electrically connected to control pins 105a, 105b, 105c, 105d, 105e, 105f. The main current pins 104a to 104l and the control pins 105a to 105f are disposed so as to extend upward, go through the second circuit substrate 107, and protrude out from the upper surface side of the second circuit substrate 107. The second main electrodes on the lower surface side of the semiconductor elements 102a to 102f are electrically connected to the conductive layer 113b.

Meanwhile, the semiconductor elements 103a to 103f are FWDs. The anode electrodes on the upper surface side of the semiconductor elements 103a to 103f are electrically connected to the main current pins 106a, 106b, 106c, 106d, 106e, 106f, 106g, 106h, 106i, 106j, 106k, 106l. The main current pins 106a to 106l are disposed to extend upward, go through the second circuit substrate 107, and protrude out from the upper surface side of the second circuit substrate 107. The cathode electrodes on the lower surface side of the semiconductor elements 103a to 103f are electrically connected to the conductive layer 113b.

The second circuit substrate 107 shown in FIG. 6 is formed of a printed substrate having an insulating layer 171, a wiring layer 172 disposed on the lower surface of the insulating layer 171, and a wiring layer 173 disposed on the upper surface of the insulating layer 171. The second circuit substrate differs from the second circuit substrate 7 of the semiconductor module according to Embodiment 1 of the present invention in that the insulating layer 171 of the semiconductor module according to the comparative example is formed of a resin material such as a glass epoxy resin or a polyimide resin. The wiring layers 172, 173 are formed of a conductive material such as copper.

The main current pins 131a, 131b, 131c, 131d are electrically connected to the conductive layer 113a, where the semiconductor elements 102a to 102f and 103a to 103f on the upper surface side of the first circuit substrate 101 are not mounted. The main current pins 131a to 131d are disposed so as to extend upward, go through the second circuit substrate 107, and protrude out from the upper surface side of the second circuit substrate 107. The main current pins 131a to 131d are electrically connected by the circuit patterns of the wiring layers 172, 173 of the second circuit substrate 107 to the main current pins 104a to 104l and the main current pins 106a to 106l.

Furthermore, first lead terminals 121a, 121b, 121c, 121d are electrically connected to the conductive layer 113a. The first lead terminals 121a to 121d extend upward, go through the insulating layer 171 of the second circuit substrate 107, and protrude out from the upper surface side of the sealing material 108.

Second lead terminals 122a, 122b, 122c, 122d are electrically connected to the conductive layer 113b, where the semiconductor elements 102a to 102f and 103a to 103f on the upper surface side of the first circuit substrate 101 are mounted. The second lead terminals 122a to 122d extend upward, go through the insulating layer 171 of the second circuit substrate 107, and protrude out from the upper surface side of the sealing material 108.

Main current pins 132a, 132b, 132c, 132d are electrically connected to the conductive layer 113c, where the semiconductor elements 102a to 102f and 103a to 103f on the upper surface side of the first circuit substrate 101 are not mounted. The main current pins 132a to 132d are disposed to extend upward, go through the second circuit substrate 107, and protrude from the upper surface side of the second circuit substrate 107. The main current pins 132a to 132d are electrically connected by the circuit patterns of the wiring layers 172, 173 of the second circuit substrate 107 to the main current pins 104a to 104l and the main current pins 106a to 106l.

Furthermore, sense lead terminals 123a, 123b are electrically connected to the conductive layer 113c. The sense lead terminals 123a, 123b extend upward, go through the insulating layer 171 of the second circuit substrate 107, and protrude out from the upper surface side of the sealing material 108.

A resistor element 109 is disposed on the conductive layer 113d, where the semiconductor elements 102a to 102f and 103a to 103f on the upper surface side of the first circuit substrate 101 are not mounted. A control pin 109a is electrically connected to the resistor element 109. The control pin 109a is disposed to extend upward, goes through the second circuit substrate 107, and protrudes out from the upper surface side of the second circuit substrate 107. The control pin 109a is electrically connected by the circuit patterns of the wiring layers 172, 173 of the second circuit substrate 107 to the control pins 105a to 105f.

Furthermore, third lead terminals 124a, 124b are electrically connected to the conductive layer 113d. The third lead terminals 124a, 124b extend upward, go through the insulating layer 171 of the second circuit substrate 107, and protrude out from the upper surface side of the sealing material 108.

Thus, in the semiconductor module according to the comparative example, the conductive layers 113a, 113c, 113d are formed electrically isolated from the conductive layer 113b, where the semiconductor elements 102a to 102f and 103a to 103f are mounted, and the first lead terminal 121a to 121d, the sense lead terminals 123a, 123b, and the third lead terminals 124a, 124b are respectively connected to the conductive layers 113a, 113c, 113d to extract the electrodes to outside. Therefore, as the conductive layers 113a to 113d on the upper surface side of the first circuit substrate 101, there are the patterns of the conductive layers 113a, 113c, 113d where the semiconductor elements 102a to 102f and 103a to 103f are not mounted, and the size of the semiconductor module is made larger by an amount corresponding to the patterns of the conductive layers 113a, 113c, 113d.

In order to make the size of the semiconductor module smaller, the mounting interval of the plurality of semiconductor elements 102a to 102f and 103a to 103f could conceivably be narrowed, but the narrower the mounting interval is, the more that the temperature will rise due to heat interference by heat generated from the semiconductor elements 102a to 102f and 103a to 103f, which would lower current capacity. This would increase the number of mounted semiconductor elements 102a to 102f and 103a to 103f, and thus the size of the semiconductor module would not be smaller.

In addition, the control-related electrodes, such as the control electrodes of the plurality of semiconductor elements 102a to 102f, 103a to 103f or the first main electrodes, need to have matching distances of the electrode paths to the plurality of semiconductor elements 102a to 102f and 103a to 103f to the greatest extent possible, but there are constraints on the mounting position and orientation of the plurality of semiconductor elements 102a to 102f and 103a to 103f. Thus, it is difficult to improve the heat dissipation efficiency of heat generated by the plurality of semiconductor elements 102a to 102f and 103a to 103f.

Furthermore, the second circuit substrate 107 is generally layered with a conductive foil such as copper foil on the upper and lower surfaces of a resin layer such as a glass epoxy resin or a polyimide resin, and the thermal expansion coefficient is high. Due to this, on the occasion of using solder or the like to bond the second circuit substrate 107 with the semiconductor elements 102a to 102f and 103a to 103f mounted on the first circuit substrate 101, warping occurs in one or both of the first circuit substrate 101 and the second circuit substrate 107. In particular, as the wiring layers 172 and 173 become larger, the warping becomes greater, due to the insulating layer 171 having no rigidity.

To counter this, as shown in FIG. 1 and FIG. 2, in the semiconductor module according to Embodiment 1 of the present application, the second circuit substrate 7 holds the first lead terminals 21a to 21d, the sense lead terminals 23a, 23b, and the third lead terminals 24a, 24b. Due to this, for the conductive layer 13 on the upper surface side of the first circuit substrate 1, there only needs to be regions for mounting the semiconductor elements 2a to 2f and 3a to 3f, and it is not necessary to form circuit patterns where the semiconductor elements 2a to 2f and 3a to 3f are not mounted. Therefore, when compared with the semiconductor module according to the comparative example, the size of the first circuit substrate 1 can be made smaller by an amount corresponding to the circuit patterns where the semiconductor elements 2a to 2f and 3a to 2f are not mounted, and thus it is possible to make the size of the semiconductor module smaller. Moreover, there is an improvement in the degree of freedom for arranging the control electrodes of the semiconductor elements 2a to 2f and 3a to 3f and control-related circuits such as sense circuits, and there are fewer constraints on mounting position or orientation of the semiconductor elements 2a to 2f and 3a to 3f. As a result, an arrangement with good heat dissipation efficiency is possible.

Further, by forming the insulating plate 11 of the first circuit substrate 1 of a ceramic material, and forming the insulating layer 70 of the second circuit substrate 7 of a ceramic material, it is possible to lower the difference in linear expansion coefficients between the first circuit substrate 1 and the second circuit substrate 7, and to inhibit warping of the first circuit substrate 1 or second circuit substrate 7. As a result, it is possible to make warping of the semiconductor module less likely to occur.

(Manufacturing Method of Semiconductor Module)

Next, one example of a manufacturing method of the semiconductor module according to Embodiment 1 of the present invention will be described with reference to FIGS. 8 to 11.

Figure 8:
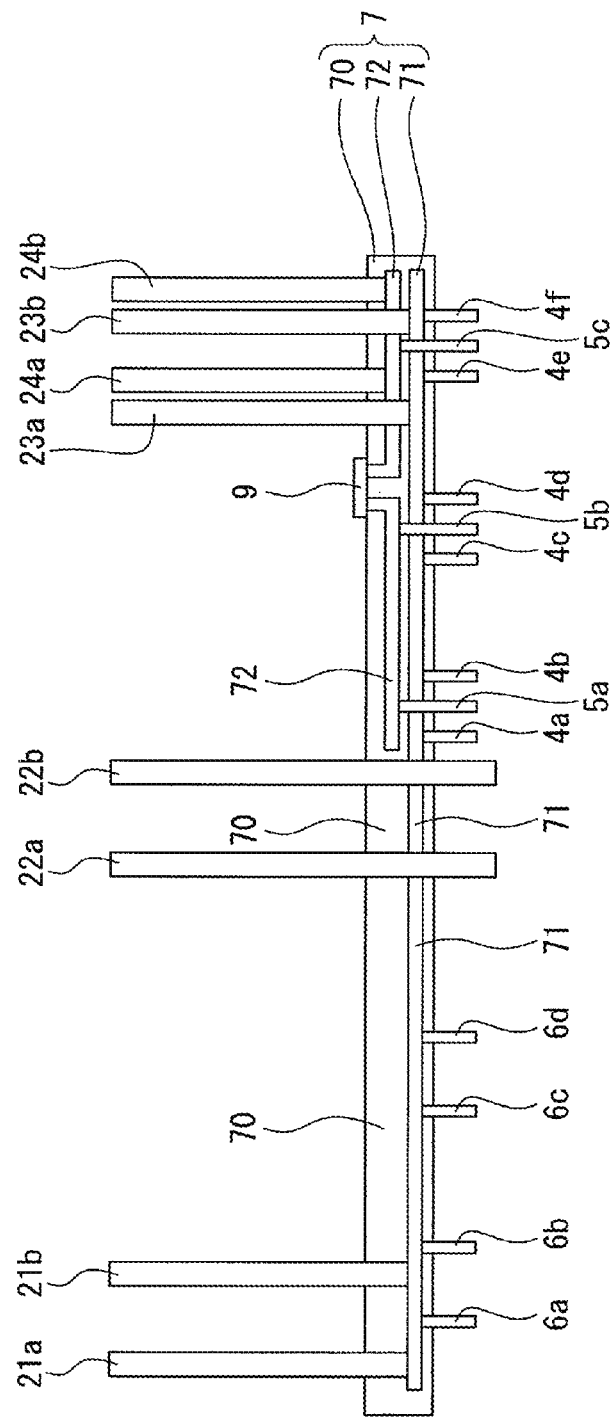
FIG. 8 is a side view showing one example of a manufacturing method for the semiconductor module according to Embodiment 1 of the present invention.

First, as shown in FIG. 8, the second circuit substrate 7 is prepared, in which the main current pins 4a to 4l, the control pins 5a to 5f, and the main current pins 6a to 6l are inserted, and in which the first lead terminals 21a to 21d, the second lead terminals 22a to 22d, the sense lead terminals 23a and 23b, and the third lead terminals 24a and 24b are held (see FIG. 2 for the main current pins 4g to 4l, the control pins 5d to 5f, the main current pins 6e to 6f, the first lead terminals 21c and 21d, and the second lead terminals 22c and 22d, which are hidden in the side view in FIG. 8).

Specifically, the second circuit substrate 7 made of the insulating layer 70, the main current wiring layer 71, and the control wiring layer 72 is formed by firing or the like. Through-holes that reach the main current wiring layer 71 and the control wiring layer 72 are formed in the insulating layer 70 of the second circuit substrate 7, and the first lead terminals 21a to 21d, the sense lead terminals 23a and 23b, and the third lead terminals 24a and 24b are pressed into the through-holes. The surfaces of the first lead terminals 21a to 21d, the sense lead terminals 23a and 23b, and the third lead terminals 24a and 24b may be coated with nickel (Ni), phosphorous (P), or tin (Sn) plating. The first lead terminals 21a to 21d, the sense lead terminals 23a and 23b, and the third lead terminals 24a and 24b may be metal bonded by solder or the like in order to suppress contact defects between the main current wiring layer 71 and the control wiring layer 72 of the second circuit substrate 7.

Meanwhile, through-holes are formed that go through the insulating layer 70 at positions where the main current wiring layer 71 and the control wiring layer 72 of the second circuit substrate 7 are not formed, and the second lead terminals 22a to 22d are held in the second circuit substrate 7 by being pressed in. The second lead terminals 22a to 22d may be held by solder bonding on the first circuit substrate 1 by forming through-holes that are a size larger than the second lead terminals 22a to 22d in the second circuit substrate 7 and then, when solder bonding the first circuit substrate 1 and the semiconductor elements 2a to 2f and 3a to 3f, performing positioning with a carbon jig or the like.

The main current pins 4a to 4l, the control pins 5a to 5f, and the main current pins 6a to 6l of the second circuit substrate 7, and the second lead terminals 22a to 22d when held in the second circuit substrate 7, have the lengths thereof from the second circuit substrate 7 adjusted in advance in accordance with the thickness of the semiconductor elements 2a to 2f and 3a to 3f, and the thickness of the solder used. This inhibits warping even after the first circuit substrate 1, the semiconductor elements 2a to 2f and 3a to 3f, and the second circuit substrate 7 have been solder bonded, and also forms the positions of the second lead terminals 22a to 22d exposed to outside of the sealing material 8 with good precision.

Figure 9:
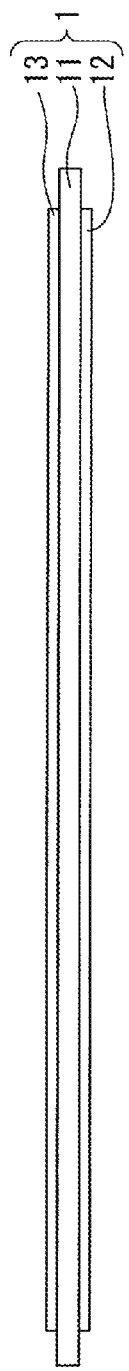
FIG. 9 is a side view following FIG. 8 and showing one example of the manufacturing method for the semiconductor module according to Embodiment 1 of the present invention.
Figure 10:
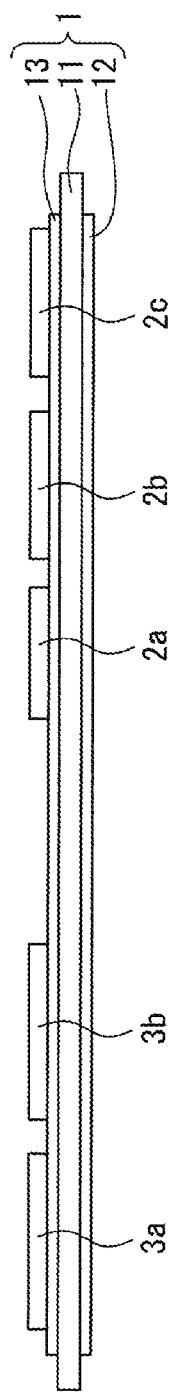
FIG. 10 is a side view following FIG. 9 and showing one example of the manufacturing method for the semiconductor module according to Embodiment 1 of the present invention.

Meanwhile, as shown in FIG. 9, the first circuit substrate 1 having the insulating plate 11, the conductive layer 12 disposed on the lower surface of the insulating plate 11, and the conductive layer 13 positioned on the upper surface of the insulating plate 11, is prepared. Paste-shaped or plate-shaped solder is coated onto the mounting positions of the semiconductor elements on the conductive layer 13 on the upper surface side of the first circuit substrate 1 by printing, a dispenser, etc., and the semiconductor elements 2a to 2f and 3a to 3f are mounted as shown in FIG. 10 (refer to FIG. 2 for the semiconductor elements 2d to 2f and 3c to 3f, which are hidden in the side view in FIG. 10).

Figure 11:
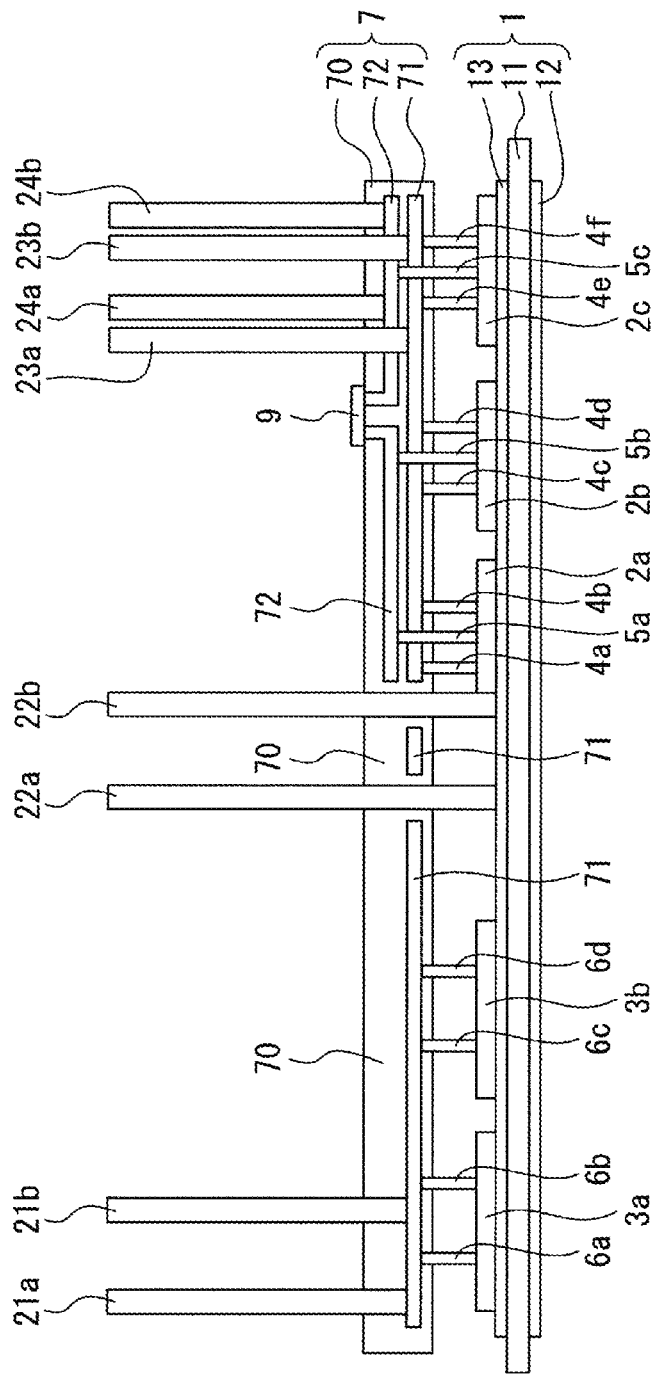
FIG. 11 is a side view following FIG. 10 and showing one example of the manufacturing method for the semiconductor module according to Embodiment 1 of the present invention.

Next, a dispenser is used to coat paste-shaped solder on the positions where the main current pins 4a to 4l, the control pins 5a to 5f, and the main current pins 6a to 6l are bonded on the semiconductor elements 2a to 2f and 3a to 3f, and on the positions where the second lead terminals 22a to 22d are bonded on the conductive layer 13. Next, the first circuit substrate 1 on which the semiconductor elements 2a to 2f and 3a to 3f are mounted, and the second circuit substrate 7 in which are inserted the main current pins 4a to 4l, the control pins 5a to 5f, and the main current pins 6a to 6l shown in FIG. 8, and in which are held the first lead terminals 21a to 21d, the second lead terminals 22a to 22d, the sense lead terminals 23a and 23b, and the third lead terminals 24a and 24b, are superimposed as shown in FIG. 11 by using a carbon jig or the like, and then solder bonding is performed by heating with reflow or the like. At such time, solder bonding is also performed for the resistor element 9 on the second circuit substrate 7.

Next, using a mold or the like, resin molding is performed with a thermosetting resin such as an epoxy resin so as to expose the conductive layer 13 on the lower side of the first circuit substrate 1, and the tips of the first lead terminals 21a to 21d, the second lead terminals 22a to 22d, the sense lead terminals 23a and 23b, and the third lead terminals 24a and 24b. The resin molding may be any of transfer molding, compression molding, or potting, and can be selected as appropriate in accordance with the resin material used or the like. This results in the completion of the semiconductor module shown in FIG. 1.

The aforementioned manufacturing method of the semiconductor module according to Embodiment 1 of the present invention makes it possible to fabricate a semiconductor module that is smaller in size. Furthermore, nut-shaped electrodes that can be fastened by bolt fastening can be attached by laser welding or solder bonding to the first lead terminals 21a to 21d, the second lead terminals 22a to 22d, the sense lead terminals 23a and 23b, and the third lead terminals 24a and 24b as necessary.

In addition, if not making the size of the semiconductor module smaller, it is possible to widen the mounting intervals of the semiconductor elements 2a to 2f and 3a to 3f. This inhibits heat interference from heat generated by the semiconductor elements 2a to 2f and 3a to 3f, and thus the junction temperature will decrease even at the same current capacity. If it not necessary to lower the junction temperature, then the current capacity can be increased.

Modification Example 1

Figure 12:
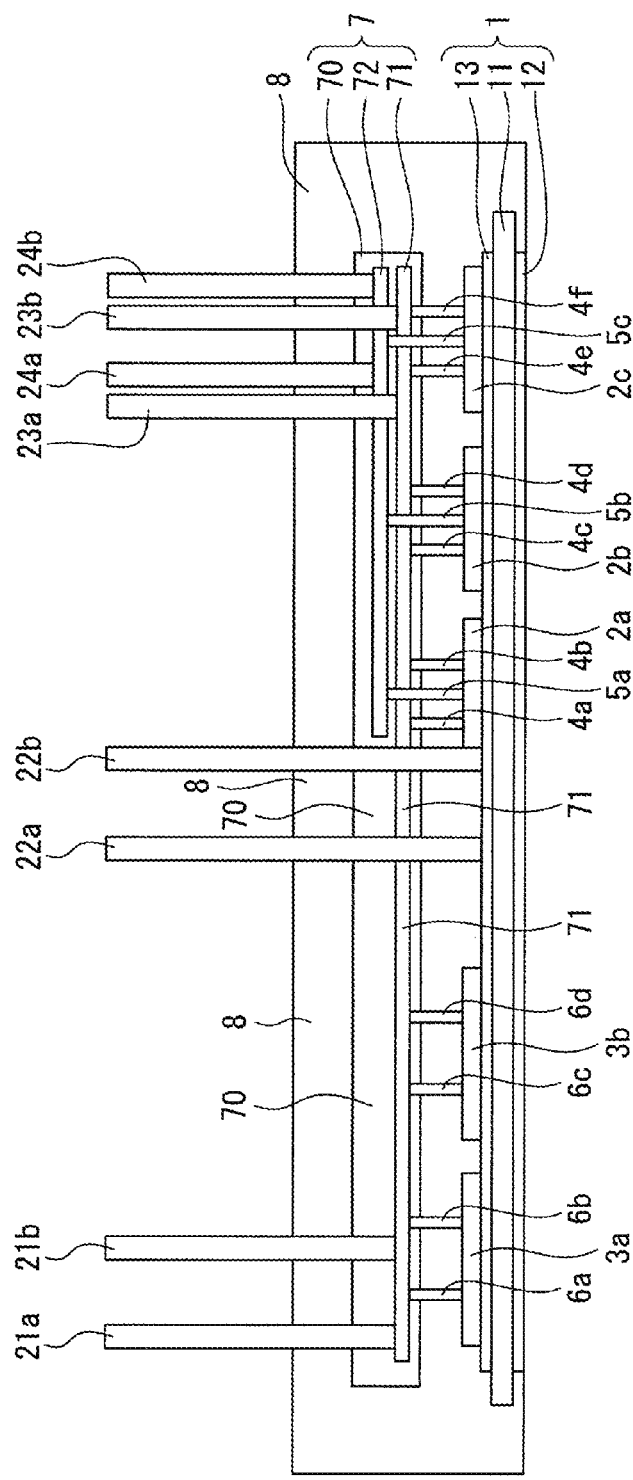
FIG. 12 is a side view showing one example of a semiconductor module according to Modification Example 1 of Embodiment 1 of the present invention.

As shown in FIG. 12, the semiconductor module according to Modification Example 1 of Embodiment 1 of the present invention differs from the semiconductor module according to Embodiment 1 of the present invention in that the resistor element 9 is not disposed on the insulating Layla 70 on the upper surface side of the second circuit substrate 7. When the resistor element 9 is not disposed, the first wiring part 72a and the second wiring part 72b may be directly connected without using the resistor element 9 in the planar pattern of the control wiring layer 72 shown in FIG. 4. Instead of disposing the resistor element 9 on the insulating layer 70 on the upper surface side of the second circuit substrate 7, the resistor element may be embedded inside the insulating layer 70, which can suppress thickness more than if the resistor were disposed on the insulating layer 70.

Modification Example 2

Figure 13:
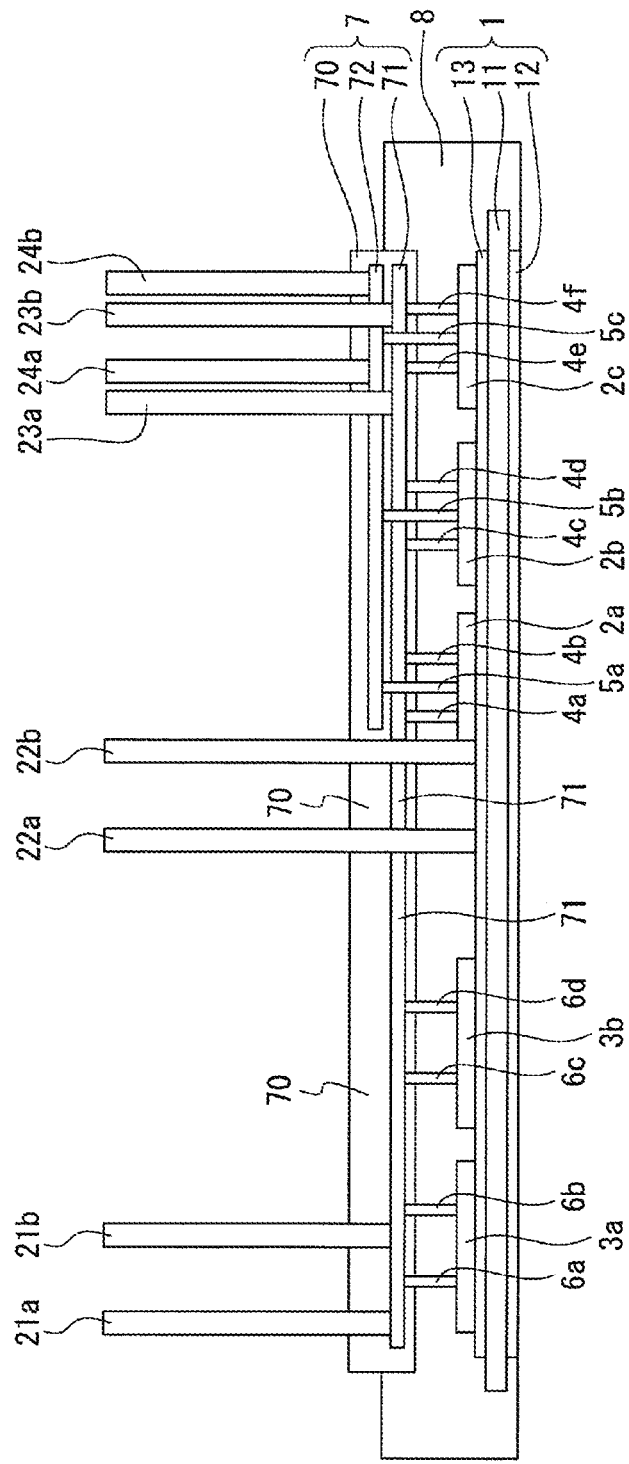
FIG. 13 is a side view showing one example of a semiconductor module according to Modification Example 2 of Embodiment 1 of the present invention.

As shown in FIG. 13, the semiconductor module according to Modification Example 2 of Embodiment 1 of the present invention differs from the semiconductor module according to Embodiment 1 of the present invention in that the sealing material 8 is disposed so as to expose the upper surface of the insulating layer 70 of the second circuit substrate 7. The exposed upper surface of the insulating layer 70 may have a cooler or other component or the like mounted thereon, for example. Modification Example 2 of Embodiment 1 of the present invention makes it possible to also perform cooling from the upper surface side of the insulating layer 70 of the second circuit substrate 7 and to improve heat dissipation efficiency.

Embodiment 2

Figure 14:
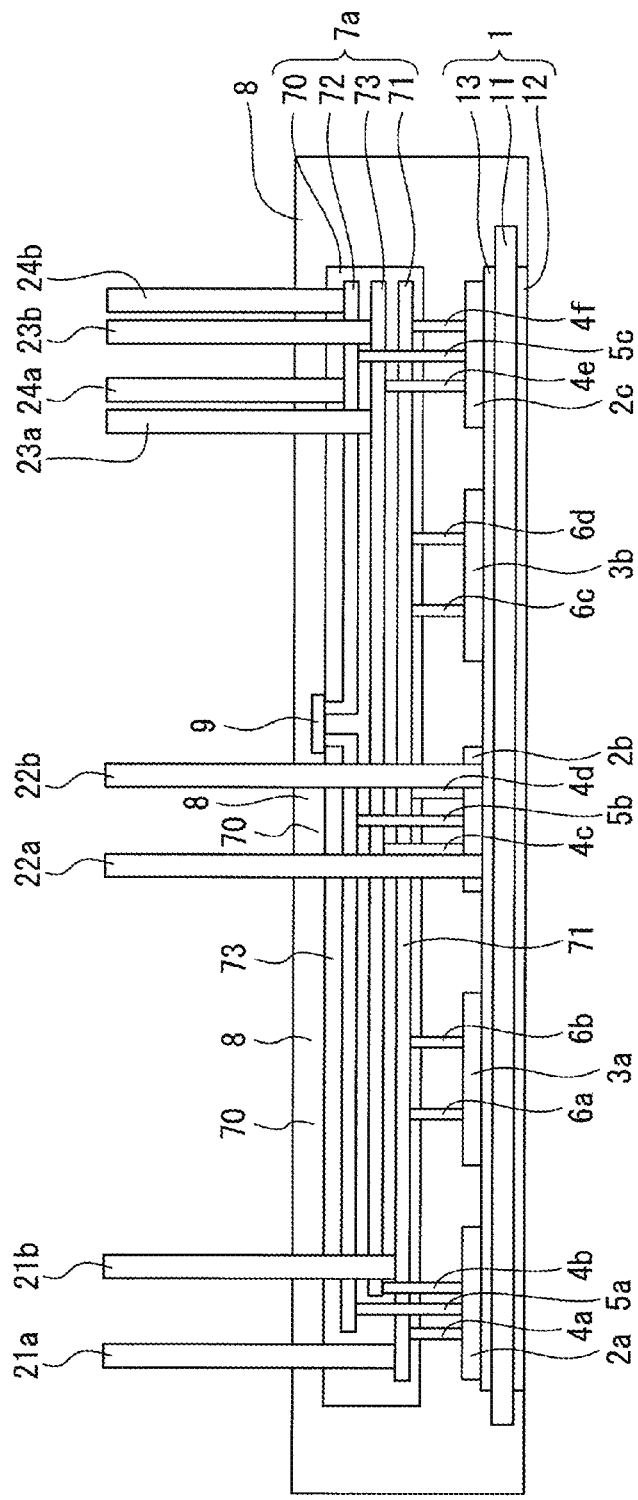
FIG. 14 is a side view showing one example of a semiconductor module according to Embodiment 2 of the present invention.
Figure 15:
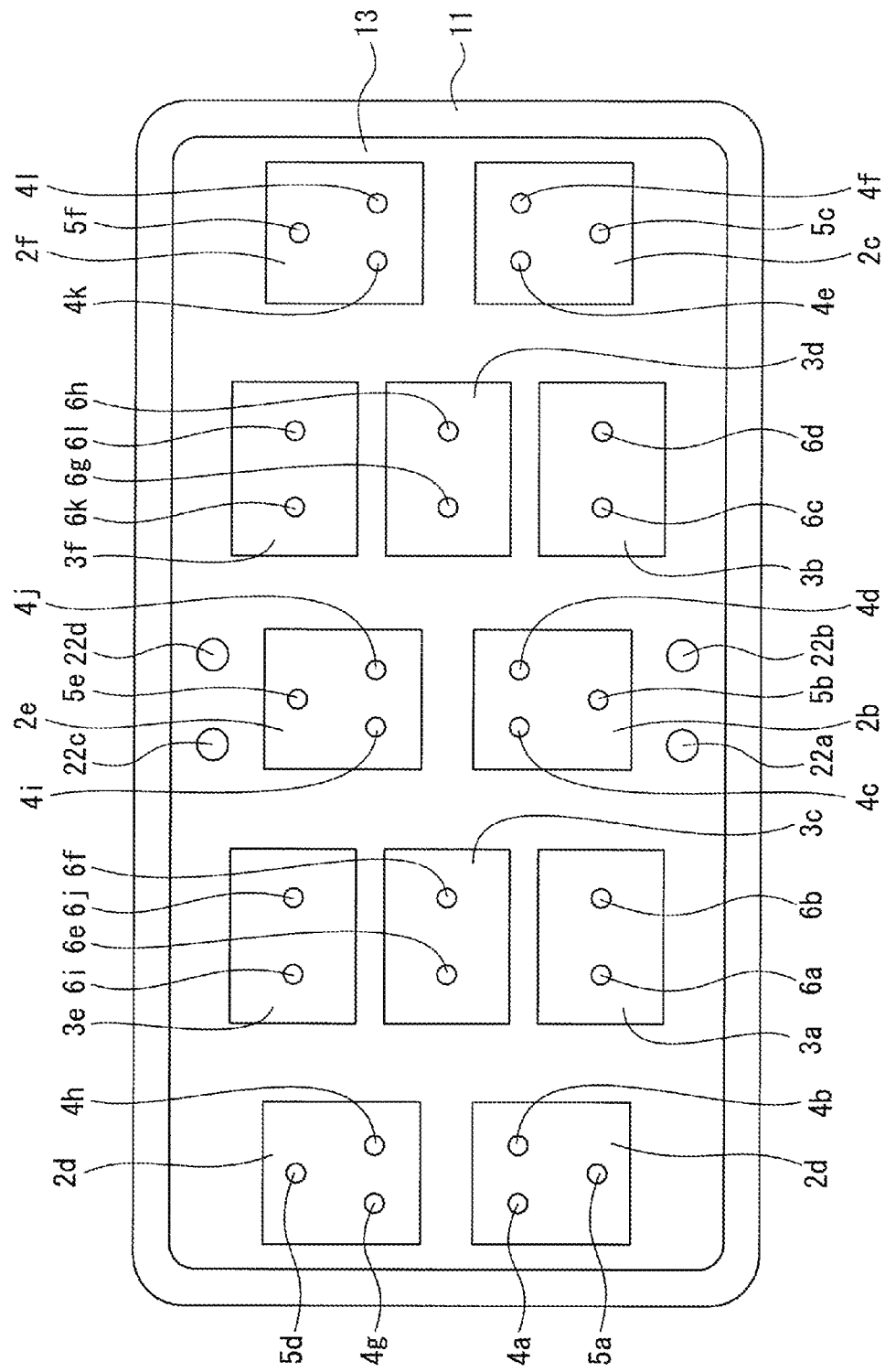
FIG. 15 is a top view showing one example of a first circuit substrate of the semiconductor module according to Embodiment 2 of the present invention.

FIG. 14 is a side view of a semiconductor module according to Embodiment 2 of the present invention, and FIG. 15 is a top view of the semiconductor module according to Embodiment 2 of the present invention of a first circuit substrate 1 and semiconductor elements (semiconductor chips) 2a to 2f and 3a to 3f seen from above while omitting a second circuit substrate 7a and a sealing material 8.

As shown in FIG. 14 and FIG. 15, the semiconductor module according to Embodiment 2 of the present invention includes: the first circuit substrate 1; the semiconductor elements 2a to 2f and 3a to 3f disposed on the first circuit substrate 1; the second circuit substrate 7a disposed on the semiconductor elements 2a to 2f and 3a to 3f; and the sealing material that seals the semiconductor elements 2a to 2f and 3a to 3f.

As shown in FIG. 14 and FIG. 15, the semiconductor module according to Embodiment 2 of the present invention differs from the semiconductor module according to Embodiment 1 of the present invention in that the semiconductor elements 2a to 2f and 3a to 3f are disposed alternately in the longitudinal direction of the semiconductor module. The heat generated during operation of the semiconductor elements 2a to 2f and 3a to 3f is greater for the MOSFETs forming the semiconductor elements 2a to 2f than for the diode elements forming the semiconductor elements 3a to 3f. By alternately disposing the semiconductor elements 2a to 2f and 3a to 3f, it is possible to suppress a rise in temperature caused by heat interference among the MOSFETs forming the semiconductor elements 2a to 2f. However, the wiring distance to the control electrodes of the MOSFETs forming the semiconductor elements 2a to 2f becomes longer, and thus inductance between gate/source becomes larger.

Furthermore, as shown in FIG. 14, in the semiconductor module according to Embodiment 2 of the present invention, the second circuit substrate 7a differs from the second circuit substrate 7 in having three wiring layers inside the insulating layer 70, whereas the second circuit substrate of the semiconductor module according to Embodiment 1 of the present invention has two wiring layers. In other words, the second wiring substrate 7a has an insulating layer 70, a main current wiring layer 71 embedded in the insulating layer 70, a control wiring layer 72 embedded in a layer above the main current wiring layer 71 of the insulating layer 70, and a sense wiring layer 73 embedded between the main current wiring layer 71 and the control wiring layer 72 of the insulating layer 70.

By setting the thickness of the main current wiring layer 71 of the second circuit substrate 7a to approximately 0.2 mm or more and preferably approximately 0.4 mm or more, for example, it is possible to inhibit heat generation even when large currents are passed. The thickness of the insulating layer 70 between the sense wiring layer 73 and the control wiring layer 72 is approximately 0.5 mm or less, and preferably approximately 0.1 mm or less, for example.

Figure 16:
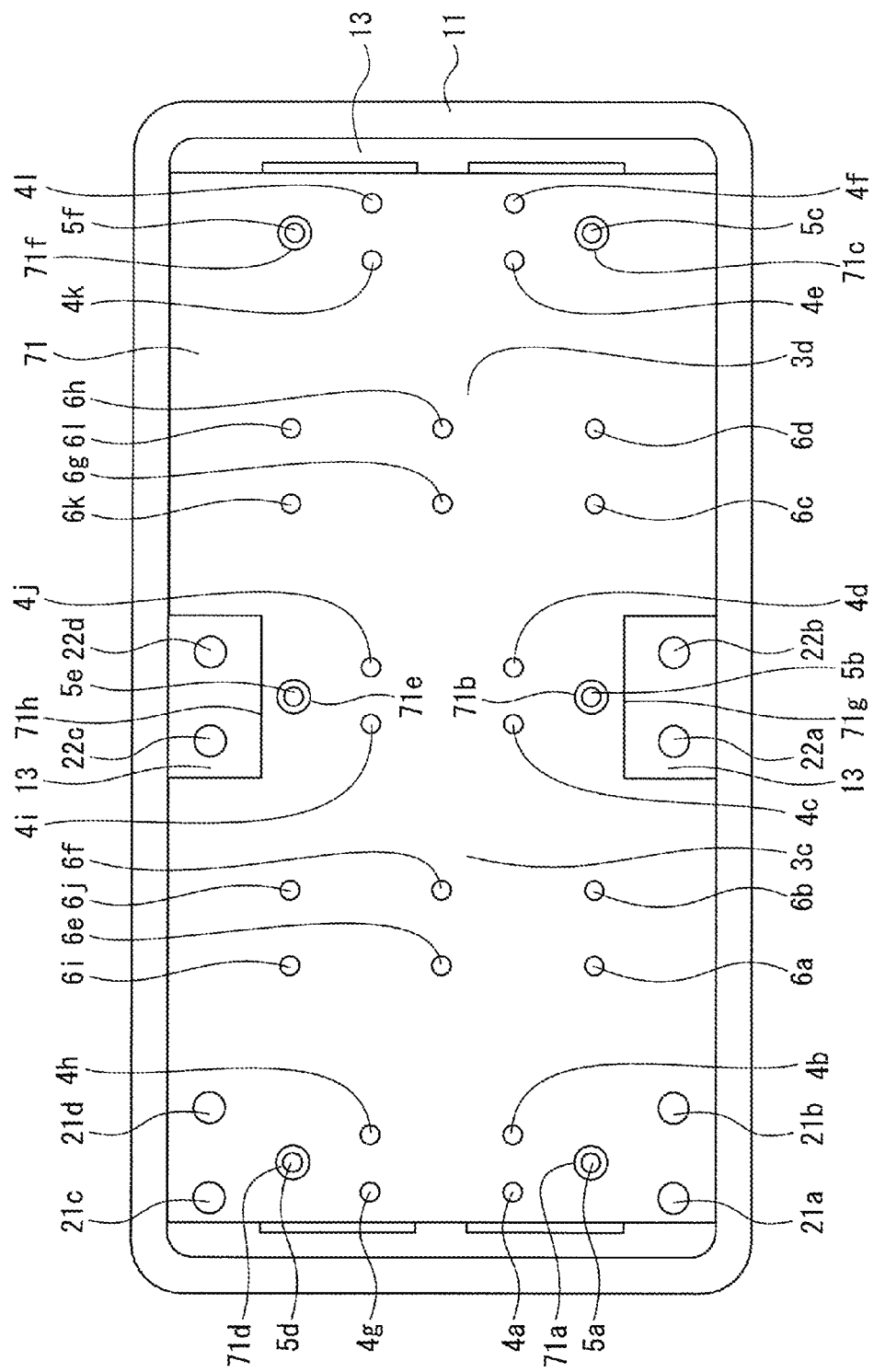
FIG. 16 is a top view showing one example of a main current wiring layer of the semiconductor module according to Embodiment 2 of the present invention.

FIG. 16 shows a planar pattern of the main current wiring layer 71 on the lower layer side of the second circuit substrate 7a in correspondence with the first circuit substrate 1 and the semiconductor elements 2a to 2f and 3a to 3f. The main current wiring layer 71 is electrically connected by the main current pins 4a to 4l to the first main electrodes of the semiconductor elements 2a to 2f and 3a to 3f. The main current wiring layer 71 has openings (through-holes) 71a to 71f that the control pins 5a to 5f go through, and openings (cutouts) 71g and 71h that the second lead terminals 22a to 22d go through. The main current wiring layer 71, the control pins 5a to 5f, and the second lead terminals 22a to 22d are insulated via portions of the insulating layer 70.

First lead terminals (first external connection terminals) 21a, 21b, 21c, 21d are electrically connected to the main current wiring layer 71. The first lead terminals 21a to 21d are disposed so as to extend upward from the top of the main current wiring layer 71, go through the insulating layer 70 on the upper side of the main current wiring layer 71 as shown in FIG. 14, and protrude out from the upper surface of the sealing material 8. The first lead terminals 21a to 21d are positioned above the conductive layer 13 so as to overlap with the conductive layer 13 in the direction normal to the upper surface of the main current wiring layer 71.

Figure 17:
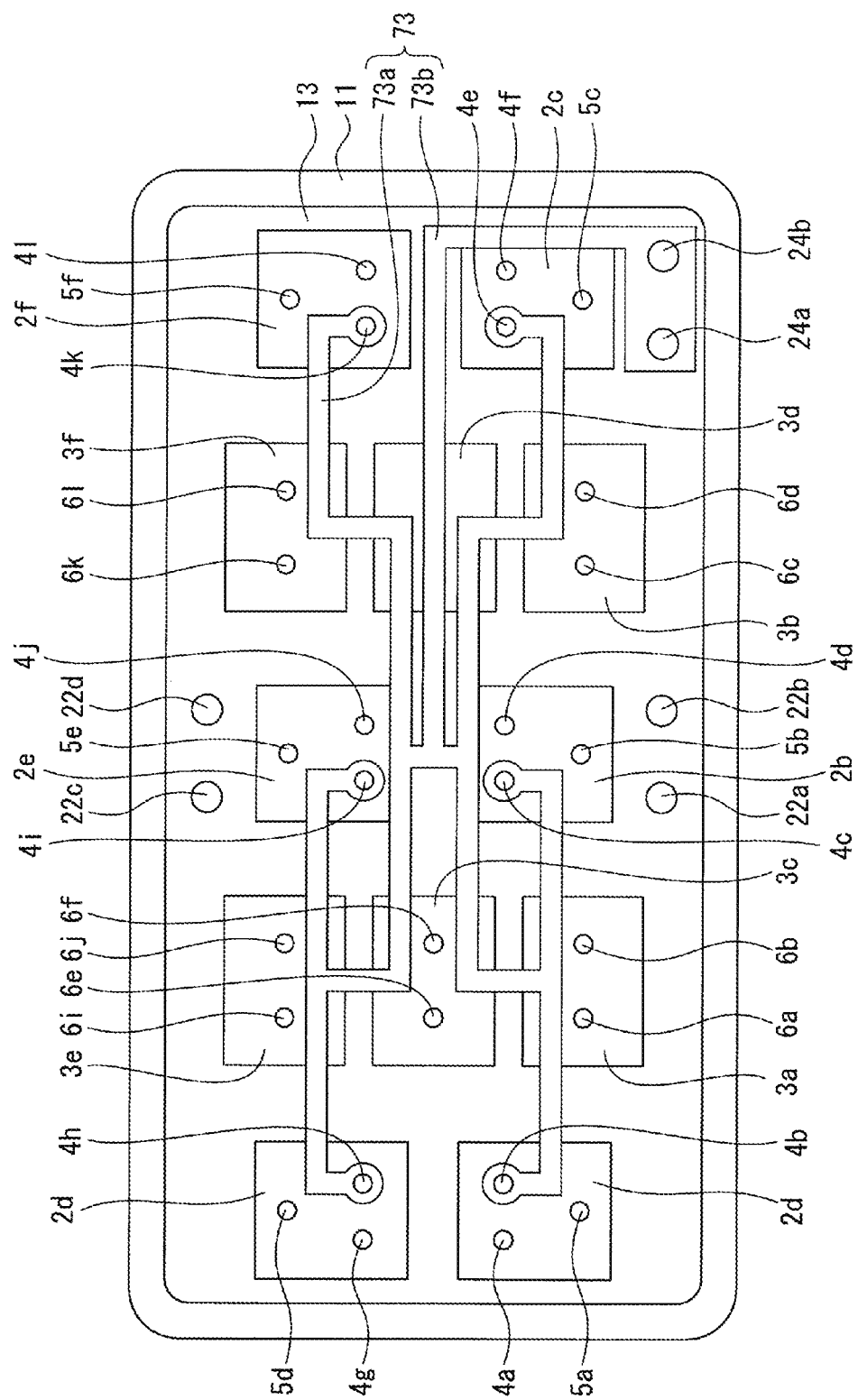
FIG. 17 is a top view showing one example of a sense wiring layer of the semiconductor module according to Embodiment 2 of the present invention.

FIG. 17 shows a planar pattern of the sense wiring layer 73, which is the middle layer of the second circuit substrate 7a in correspondence with the first circuit substrate 1 and the semiconductor elements 2a to 2f and 3a to 3f. The sense wiring layer 73 is disposed so as to face at least a portion of the control wiring layer 72 with at least a portion of the insulating layer 70 interposed therebetween. As shown in FIG. 17, in order to wire the plurality of control pins 4a, 4b, 4c, 4e, 4h, 4k at equal lengths, the sense wiring layer 73 includes a first wiring part 72a for wiring the plurality of control pins 4a, 4b, 4c, 4e, 4h, 4k, and a second wiring part 73b for wiring the first wiring part 72a and the sense lead terminals 23a, 23b for measuring the main current.

In other words, the sense lead terminals 23a and 23b are electrically connected to the sense wiring layer 73. The sense lead terminals 23a and 23b are disposed so as to extend upward from the top of the sense wiring layer 73, go through the insulating layer 70 on the upper side of the sense wiring layer 73 as shown in FIG. 14, and protrude out from the upper surface of the sealing material 8. The sense lead terminals 23a and 23b are positioned above the conductive layer 13 so as to overlap with the conductive layer 13 in the direction normal to the upper surface of the sense wiring layer 73.

Figure 18:
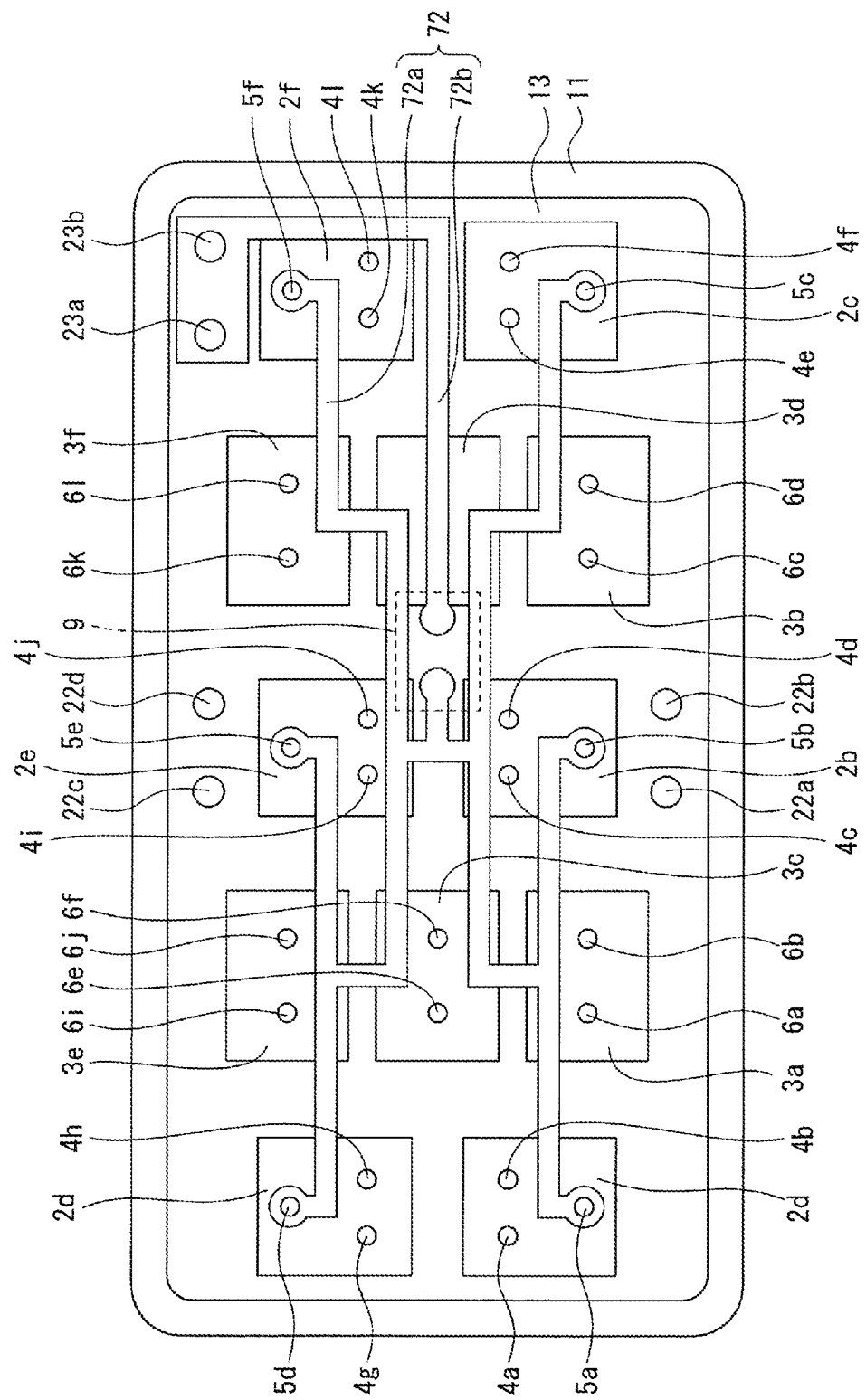
FIG. 18 is a top view showing one example of a control wiring layer of the semiconductor module according to Embodiment 2 of the present invention.

FIG. 18 shows a planar pattern of the control wiring layer 72 on the upper layer side of the second circuit substrate 7a in correspondence with the first circuit substrate 1 and the semiconductor elements 2a to 2f and 3a to 3f. The control wiring layer 72 is electrically connected by the control pins 5a to 5f to the control electrodes of the semiconductor elements 2a to 2f. Third lead terminals (third external connection terminals) 24a and 24b are electrically connected to the control wiring layer 72.

The third lead terminals 24a and 24b are disposed so as to extend upward from the top of the control wiring layer 72, go through the insulating layer 70 on the upper side of the control wiring layer 72 as shown in FIG. 14, and protrude out from the upper surface of the sealing material 8. The third lead terminals 24a and 24b are positioned above the conductive layer 13 so as to overlap with the conductive layer 13 in the direction normal to the upper surface of the control wiring layer 72. The resistor element 9 is electrically connected between the control wiring layer 72 and the third lead terminals 24a, 24b.

As shown in FIG. 18, in order to wire the plurality of control pins 5a to 5f at equal lengths, the control wiring layer 72 includes a first wiring part 72a for wiring the plurality of control pins 5a to 5f, and a second wiring part 72b for wiring the third lead terminals 24a, 24b and the resistor element 9.

The rest of the configuration of the semiconductor module according to Embodiment 2 of the present invention is the same as the semiconductor module according to Embodiment 1 of the present invention, and thus overlapping descriptions will be omitted.

With the semiconductor module according to Embodiment 2 of the present invention, the second circuit substrate 7a holds the first lead terminals 21a to 21d, the sense lead terminals 23a and 23b, and the third lead terminals 24a and 24b, similarly to Embodiment 1 of the present invention. Due to this, for the conductive layer 13 on the upper surface side of the first circuit substrate 1, there only needs to be regions for mounting the semiconductor elements 2a to 2f and 3a to 3f, and it is not necessary to form circuit patterns where the semiconductor elements 2a to 2f and 3a to 3f are not mounted. Therefore, it is possible to make the size of the first circuit substrate 1 smaller, and thus possible to make the size of the semiconductor module smaller.

Moreover, there is an improvement in the degree of freedom for arranging the control electrodes of the semiconductor elements 2a to 2f and 3a to 3f and control-related circuits such source sense circuits, and there are fewer constraints on the mounting position or orientation of the semiconductor elements 2a to 2f and 3a to 3f. For example, by alternately disposing the two types of semiconductor elements 2a to 2f and semiconductor elements 3a to 3f with differing heat generating amounts, it is possible to improve heat dissipation efficiency.

Further, by forming the insulating plate 11 of the first circuit substrate 1 of a ceramic material, and forming the insulating layer 70 of the second circuit substrate 7a of a ceramic material, it is possible to lower the difference in linear expansion coefficients between the first circuit substrate 1 and the second circuit substrate 7a, and to inhibit warping of the first circuit substrate 1 or the second circuit substrate 7a. As a result, it is possible to make warping of the semiconductor module less likely to occur.

As a unique effect of the semiconductor module according to Embodiment 2 of the present invention, the control wiring layer 72 and the sense wiring layer 73 for measuring the main current are disposed so as to face each other with the insulating layer 70 interposed therebetween. Additionally, by the wiring pattern of the sense wiring layer 73 being disposed so as to overlap with at least a portion of the wiring pattern of the control wiring layer 72, it is possible to reduce inductance. As a result, it is possible to improve the time rate of change of the current (di/dt) during rising of the gate current, and to achieve a high frequency.

Other Embodiments

The present invention was described using the embodiments above, but the descriptions and drawings forming this part of the disclosure should not be construed as limiting the present invention. Various substitute embodiments, examples, and applied techniques should be clear to a person skilled in the art based on this disclosure.

Figure 19:
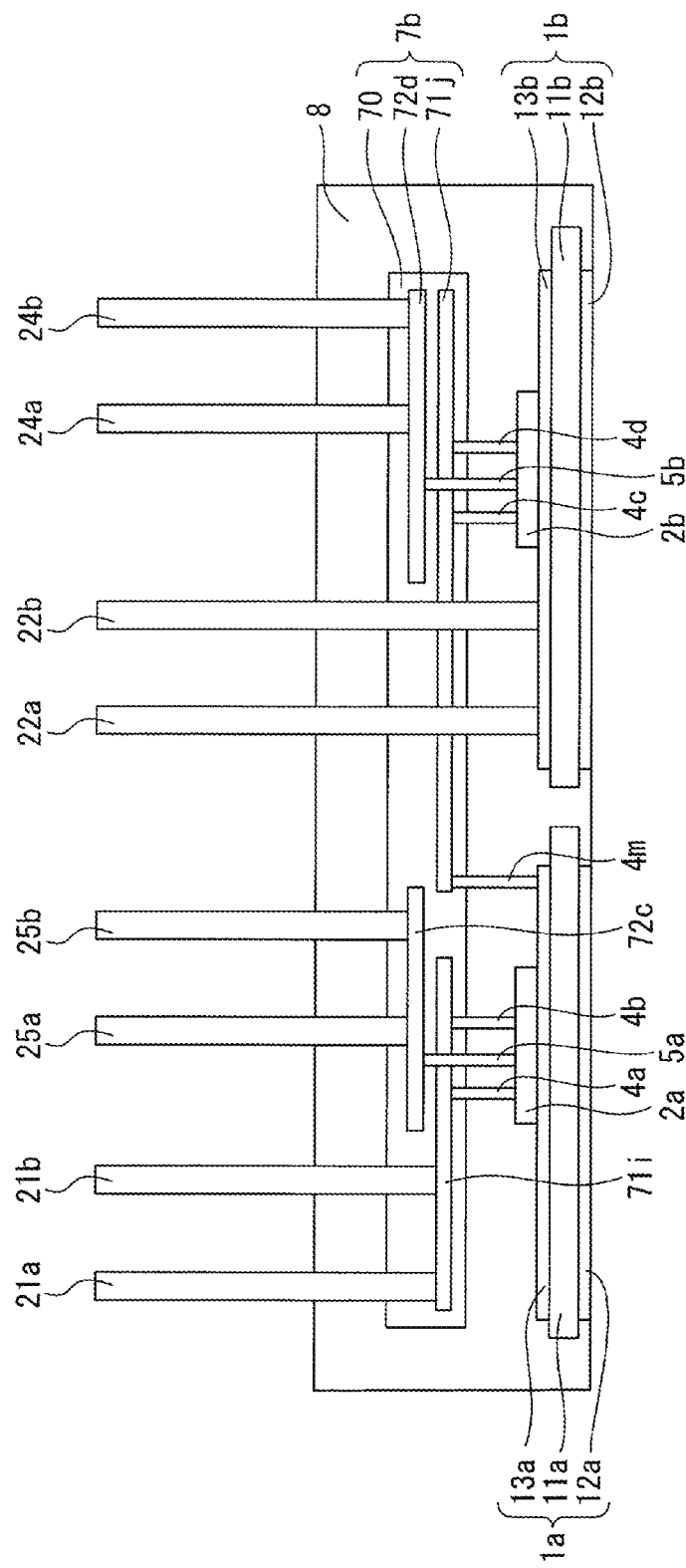
FIG. 19 is a side view showing one example of a semiconductor module according to another embodiment of the present invention.

For example, in Embodiments 1 and 2 of the present invention, a 1-in-1 type semiconductor module forming a portion of a half-bridge circuit was illustratively shown, but a 2-in-1 type semiconductor module forming a half-bridge circuit may be used. As shown in FIG. 19, for example, a 2-in-1 type semiconductor module includes: two first circuit substrates 1a, 1b; semiconductor elements 2a, 2b mounted on the upper surfaces of the first circuit substrates 1a, 1b; a second circuit substrate 7b disposed above the semiconductor elements 2a, 2b; and a sealing material 8 that seals the semiconductor elements 2a, 2b.

The first circuit substrate 1a has an insulating plate 11a, a conductive layer 12a disposed on the lower surface of the insulating plate 11a, and a conductive layer 13a disposed on the upper surface of the insulating plate 11a. The semiconductor element 2a is mounted on the first circuit substrate 1a. Main current pins 4a, 4b are connected to the first main electrode on the upper surface side of the semiconductor element 2a, and a control pin 5a is connected to the control electrode. A main current pin 4m is connected to the conductive layer 13a on the upper surface side of the first circuit substrate 1a.

The first circuit substrate 1b has an insulating plate 11b, a conductive layer 12b disposed on the lower surface of the insulating plate 11b, and a conductive layer 13b disposed on the upper surface of the insulating plate 11b. The semiconductor element 2b is mounted on the first circuit substrate 1b. Main current pins 4c, 4d are connected to the first main electrode on the upper surface side of the semiconductor element 2b, and a control pin 5a is connected to the control electrode. Second lead terminals 22a, 22b are connected to the conductive layer 13b on the upper surface side of the first circuit substrate 1b.

The second circuit substrate 7b has an insulating layer 70, main current wiring layers 71i and 71j embedded in the insulating layer 70, and two wiring layers of control wiring layers 72c and 72d embedded in a layer above the main current wiring layers 71i and 71j of the insulating layer 70. The second circuit substrate 7b may have three wiring layers by further having a sense wiring layer 73, similarly to Embodiment 2 of the present invention.

The main current pains 4a, 4b and the first lead terminals 21a, 21b are connected to the main current wiring layer 71i of the second circuit substrate 7b. The main current pins 4c, 4d, 4m are connected to the main current wiring layer 71j of the second circuit substrate 7b. The control pin 5a and third lead terminals 25a, 25b are connected to the control wiring layer 72c of the second circuit substrate 7b. The control pin 5b and third lead terminals 24a, 24b are connected to the control wiring layer 72d of the second circuit substrate 7b.

Alternatively, instead of using the two first circuit substrates 1a, 1b shown in FIG. 19, the 2-in-1 type semiconductor module may be formed by using one first circuit substrate and dividing the conductive layer on the upper surface side of the first circuit substrate into two regions.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor module, comprising:
    a first circuit substrate having an insulating plate and a conductive layer disposed on the insulating plate;
    a plurality of semiconductor elements on the conductive layer, the semiconductor elements each having a control electrode and a first main electrode on an upper surface thereof and a second main electrode on a bottom surface thereof, the second main electrode being in contact with and electrically connected to the conductive layer;
    a second circuit substrate disposed above the semiconductor elements, the second circuit substrate having an insulating layer, a main current wiring layer embedded in the insulating layer, and a control wiring layer embedded in the insulating layer, the control wiring layer being positioned in a layer above the main current wiring layer;
    main current pins connecting each of the first main electrodes and the main current wiring layer;
    control pins connecting each of the control electrodes and the control wiring layer;
    a first lead terminal vertically extending upwards from and in contact with the main current wiring layer of the second circuit substrate;
    a second lead terminal vertically extending upwards from and in contact with the conductive layer of the first circuit substrate;
    a third lead terminal vertically extending upwards from and in contact with the control wiring layer of the second circuit substrate; and
    a sealing material covering at least an upper surface of the first circuit substrate, side surfaces and the upper surfaces of the semiconductor elements, and a lower surface of the second circuit substrate,
    wherein in a plan view, the first lead terminal and the third lead terminal are positioned above the conductive layer connected to the second main electrodes.

2. The semiconductor module according to claim 1, wherein the insulating plate and the insulating layer are made of ceramic.

3. The semiconductor module according to claim 2, further comprising a resistor element disposed on an upper surface of the insulating layer of the second circuit substrate, the resistor element being inserted in a current path in the control wiring layer to the third lead terminal.

4. The semiconductor module according to claim 3, wherein the control wiring layer includes:
    a first wiring part for wiring the plurality of control pins and the resistor element such that the plurality of control pins are wired at equal lengths; and
    a second wiring part for wiring the resistor element and the third lead terminal.

5. The semiconductor module according to claim 2, wherein the sealing material exposes a lower surface of the first circuit substrate and an upper surface of the insulating layer of the second circuit substrate.

6. The semiconductor module according to claim 2, wherein the second circuit substrate further includes:
    a sense wiring layer embedded in the insulating layer between the main current wiring layer and the control wiring layer and connected to at least some of the first main electrodes of the semiconductor elements.

7. The semiconductor module according to claim 6, wherein the sense wiring layer is disposed so as to face at least a portion of the control wiring layer.

8. The semiconductor module according to claim 1, further comprising a resistor element disposed on an upper surface of the insulating layer of the second circuit substrate, the resistor element being inserted in a current path in the control wiring layer to the third lead terminal.

9. The semiconductor module according to claim 8, wherein the control wiring layer includes:
- a first wiring part for wiring the plurality of control pins and the resistor element such that the plurality of control pins are wired at equal lengths; and
- a second wiring part for wiring the resistor element and the third lead terminal.

10. The semiconductor module according to claim 1, wherein the first lead terminal does not extend downwards below the main current wiring layer of the second circuit substrate,
wherein the second lead terminal does not extend downwards below the conductive layer of the first circuit substrate, and
wherein the third lead terminal does not extend downwards below the control wiring layer of the second circuit substrate.

11. The semiconductor module according to claim 1, further comprising a sense lead terminal vertically extending upwards from and in contact with the main current wiring layer of the second circuit substrate.

12. The semiconductor module according to claim 1, wherein the sealing material exposes a lower surface of the first circuit substrate and an upper surface of the insulating layer of the second circuit substrate.

13. The semiconductor module according to claim 1, wherein the second circuit substrate further includes:
- a sense wiring layer embedded in the insulating layer between the main current wiring layer and the control wiring layer and connected to at least some of the first main electrodes of the semiconductor elements.

14. The semiconductor module according to claim 13, wherein the sense wiring layer is disposed so as to face at least a portion of the control wiring layer.

15. The semiconductor module according to claim 1, wherein the plurality of semiconductor elements are arranged in two rows along a longitudinal direction of the semiconductor module.

16. A semiconductor module, comprising:
- a first circuit substrate having an insulating plate and a conductive layer disposed on the insulating plate;
- a plurality of semiconductor elements on the conductive layer, the semiconductor elements each having a control electrode and a first main electrode on an upper surface thereof and a second main electrode on a bottom surface thereof, the second main electrode being in contact with and electrically connected to the conductive layer;
- a second circuit substrate disposed above the semiconductor elements, the second circuit substrate having an insulating layer, a main current wiring layer embedded in the insulating layer, and a control wiring layer embedded in the insulating layer, the control wiring layer being positioned in a layer above the main current wiring layer;
- main current pins connecting each of the first main electrodes and the main current wiring layer;
- control pins connecting each of the control electrodes and the control wiring layer;
- a first lead terminal vertically extending upwards from and in contact with the main current wiring layer of the second circuit substrate;
- a second lead terminal vertically extending upwards from and in contact with the conductive layer of the first circuit substrate;
- a third lead terminal vertically extending upwards from and in contact with the control wiring layer of the second circuit substrate;
- a sealing material covering at least an upper surface of the first circuit substrate, side surfaces and the upper surfaces of the semiconductor elements, and a lower surface of the second circuit substrate; and
- a resistor element disposed on an upper surface of the insulating layer of the second circuit substrate, the resistor element being inserted in a current path in the control wiring layer to the third lead terminal,
wherein the control wiring layer includes:
  - a first wiring part for wiring the plurality of control pins and the resistor element such that the plurality of control pins are wired at equal lengths; and
  - a second wiring part for wiring the resistor element and the third lead terminal.

17. The semiconductor module according to claim 16, further comprising a sense lead terminal vertically extending upwards from and in contact with the main current wiring layer of the second circuit substrate.

18. The semiconductor module according to claim 16, wherein the sealing material exposes a lower surface of the first circuit substrate and an upper surface of the insulating layer of the second circuit substrate.

19. A semiconductor module, comprising:
- a first circuit substrate having an insulating plate and a conductive layer disposed on the insulating plate;
- a plurality of semiconductor elements on the conductive layer, the semiconductor elements each having a control electrode and a first main electrode on an upper surface thereof and a second main electrode on a bottom surface thereof, the second main electrode being in contact with and electrically connected to the conductive layer;
- a second circuit substrate disposed above the semiconductor elements, the second circuit substrate having an insulating layer, a main current wiring layer embedded in the insulating layer, and a control wiring layer embedded in the insulating layer, the control wiring layer being positioned in a layer above the main current wiring layer;
- main current pins connecting each of the first main electrodes and the main current wiring layer;
- control pins connecting each of the control electrodes and the control wiring layer;
- a first lead terminal vertically extending upwards from and in contact with the main current wiring layer of the second circuit substrate;
- a second lead terminal vertically extending upwards from and in contact with the conductive layer of the first circuit substrate;
- a third lead terminal vertically extending upwards from and in contact with the control wiring layer of the second circuit substrate; and
- a sealing material covering at least an upper surface of the first circuit substrate, side surfaces and the upper surfaces of the semiconductor elements, and a lower surface of the second circuit substrate,
wherein the second circuit substrate further includes a sense wiring layer embedded in the insulating layer between the main current wiring layer and the control wiring layer and connected to at least some of the first main electrodes of the semiconductor elements.

20. The semiconductor module according to claim 19, wherein the sense wiring layer is disposed so as to face at least a portion of the control wiring layer.

\* \* \* \* \*